United States Patent
Chang et al.

(10) Patent No.: US 12,261,199 B2
(45) Date of Patent: Mar. 25, 2025

(54) THERMOELECTRIC COOLING OF SEMICONDUCTOR DEVICES

(71) Applicant: TAIWAN SEMICONDUCTOR MANUFACTURING COMPANY, LTD., Hsinchu (TW)

(72) Inventors: Jen-Yuan Chang, Hsinchu (TW); Jheng-Hong Jiang, Hsinchu (TW); Chin-Chou Liu, Hsinchu County (TW); Long Song Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 197 days.

(21) Appl. No.: 17/834,289

(22) Filed: Jun. 7, 2022

(65) Prior Publication Data

US 2023/0052136 A1 Feb. 16, 2023

Related U.S. Application Data

(60) Provisional application No. 63/232,774, filed on Aug. 13, 2021.

(51) Int. Cl.
*H01L 31/058* (2006.01)
*H01L 29/06* (2006.01)
*H01L 29/10* (2006.01)
*H01L 29/78* (2006.01)

(52) U.S. Cl.
CPC .......... *H01L 29/0649* (2013.01); *H01L 29/10* (2013.01); *H01L 29/7835* (2013.01); *H01L 2924/0002* (2013.01)

(58) Field of Classification Search
CPC . H01L 29/0649; H01L 29/10; H01L 29/7835; H01L 2924/0002
USPC .......................................................... 257/467
See application file for complete search history.

(56) References Cited

U.S. PATENT DOCUMENTS

| | | | |
|---|---|---|---|
| 802,667 | A | 10/1905 | Stuart |
| 7,361,986 | B2 | 4/2008 | Yuan |
| 9,625,186 | B2 | 4/2017 | Chou |
| 2016/0204325 | A1 | 7/2016 | Cho |
| 2017/0229373 | A1* | 8/2017 | Kim ........................ H10N 10/17 |
| 2018/0261604 | A1* | 9/2018 | Woo .................... H01L 27/0207 |
| 2020/0144471 | A1 | 5/2020 | Kato |

FOREIGN PATENT DOCUMENTS

| | | |
|---|---|---|
| CN | 206907759 U | 1/2018 |
| CN | 109950390 A | 6/2019 |
| TW | 200929463 A | 7/2009 |
| TW | 201220563 A | 5/2012 |

(Continued)

*Primary Examiner* — Theresa T Doan
(74) *Attorney, Agent, or Firm* — Haynes and Boone, LLP

(57) ABSTRACT

An integrated circuit (IC) device includes a chip having a semiconductor substrate and a thermoelectric module embedded in the semiconductor substrate, where the thermoelectric module includes a first semiconductor structure electrically connected to a second semiconductor structure, where a bottom portion of thermoelectric module extends through a thickness of the semiconductor substrate, and where the first semiconductor structure and the second semiconductor structure include dopants of different conductivity types.

20 Claims, 44 Drawing Sheets

(56) References Cited

FOREIGN PATENT DOCUMENTS

| | | | |
|---|---|---|---|
| TW | 201715669 | A | 5/2017 |
| TW | 201824594 | A | 7/2018 |
| TW | 202123412 | A | 6/2021 |

\* cited by examiner

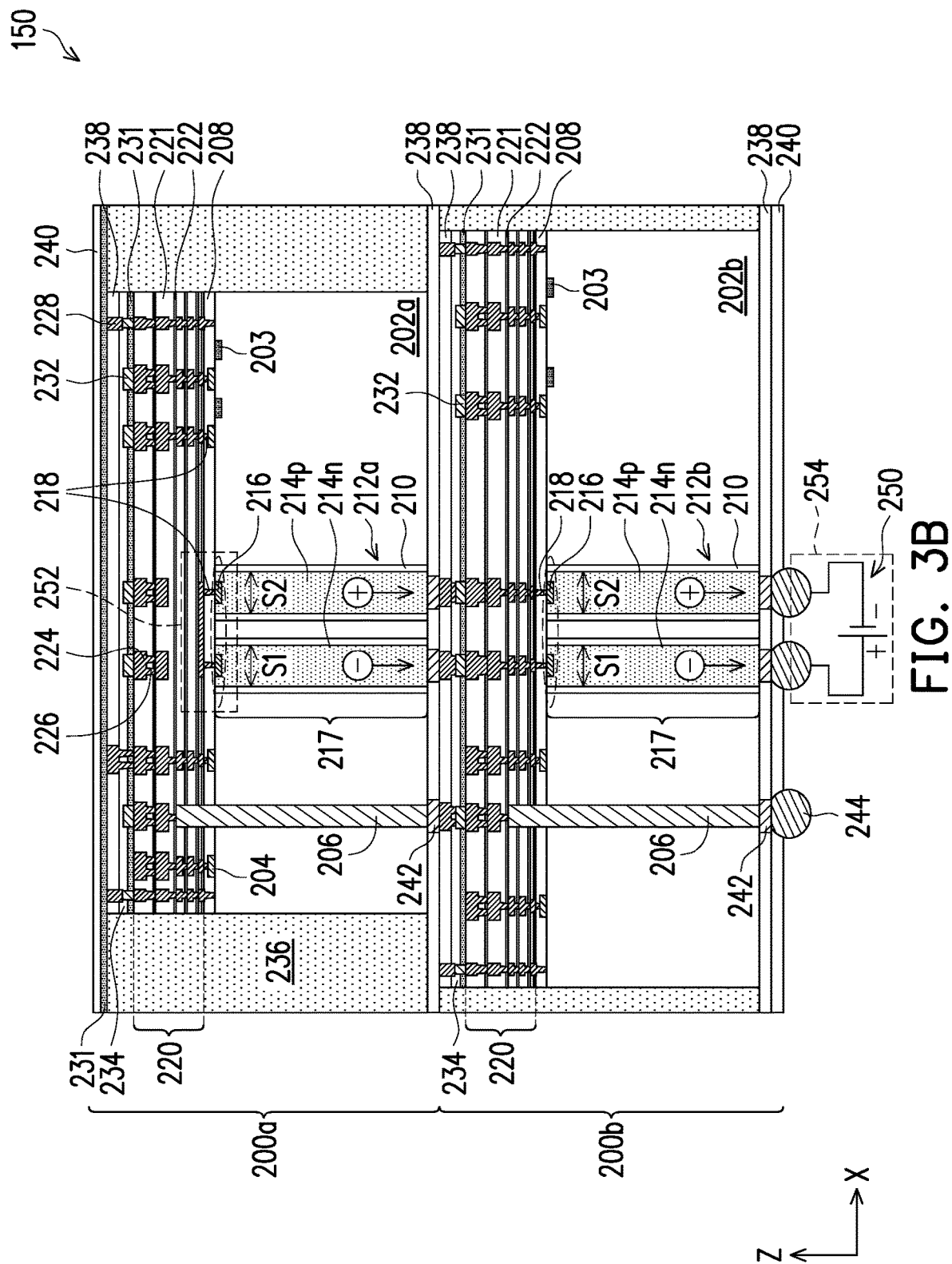

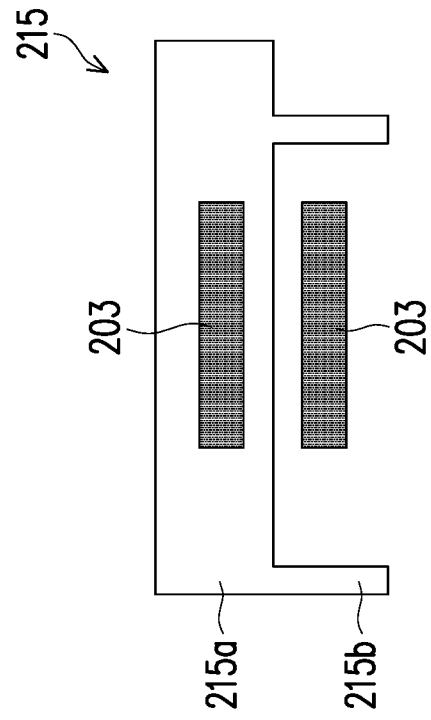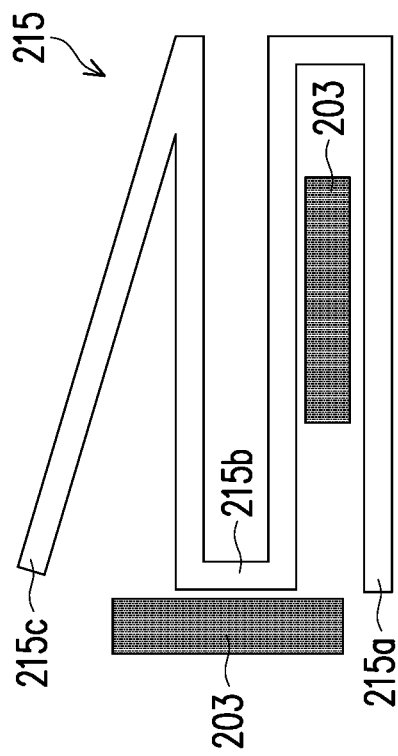

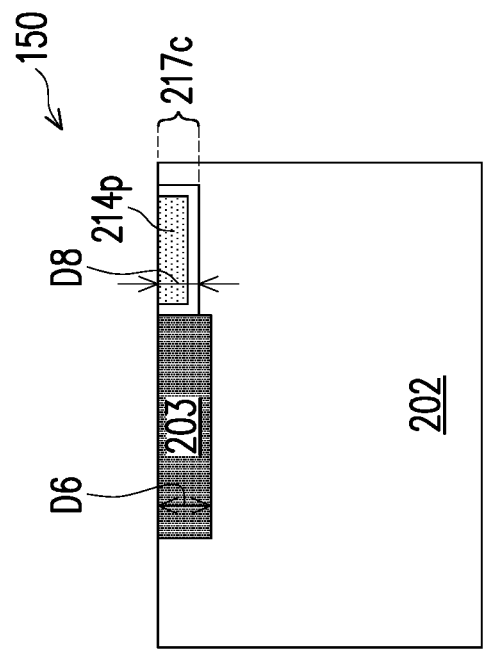
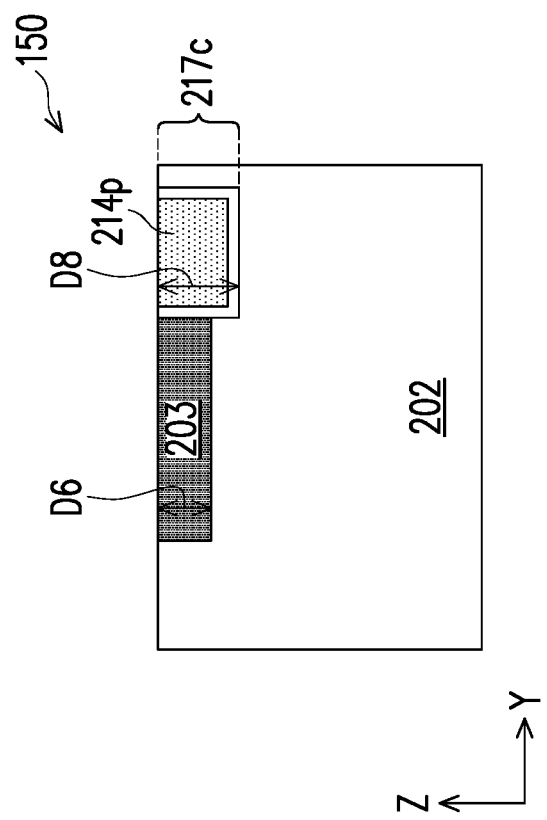
FIG. 10G
FIG. 10H

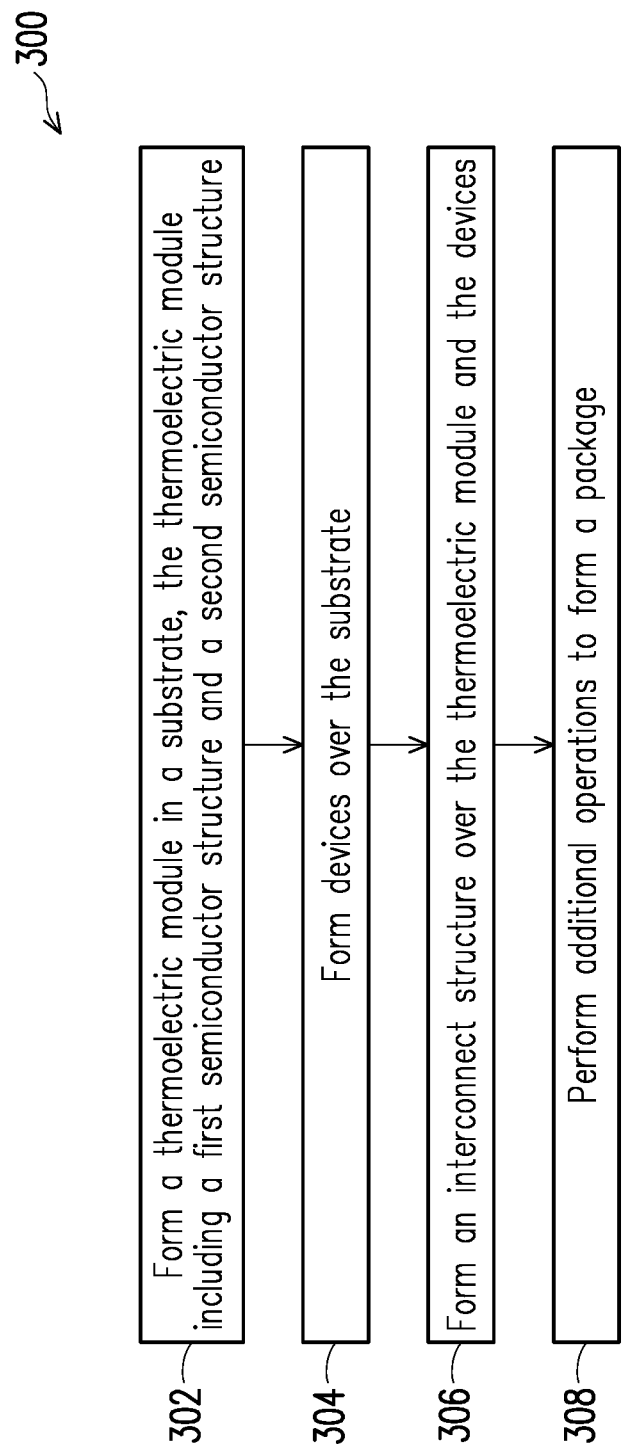

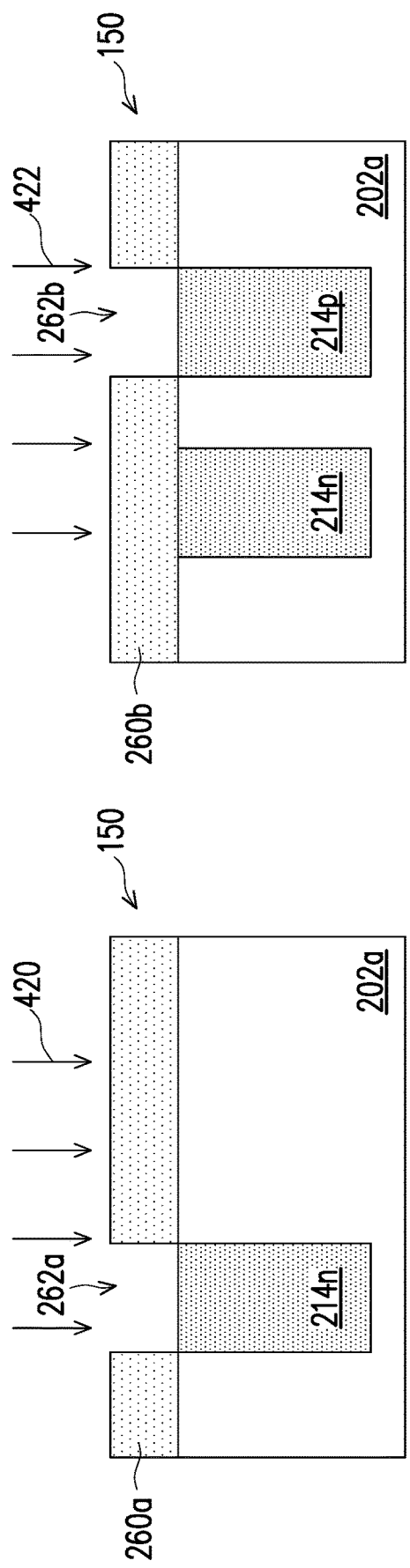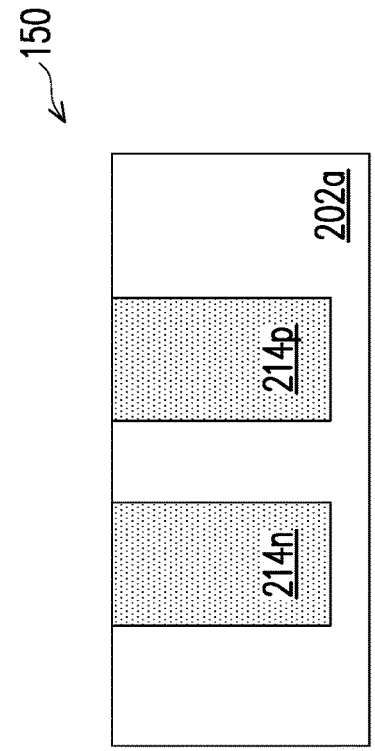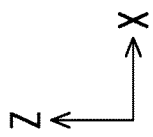
FIG. 13A
FIG. 13B
FIG. 13C

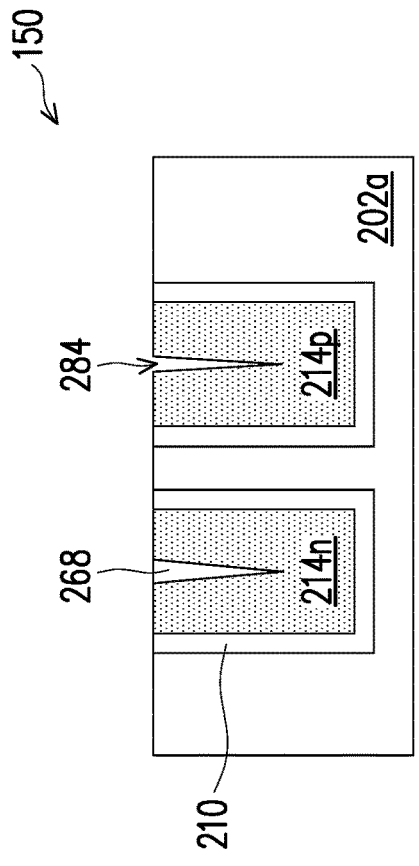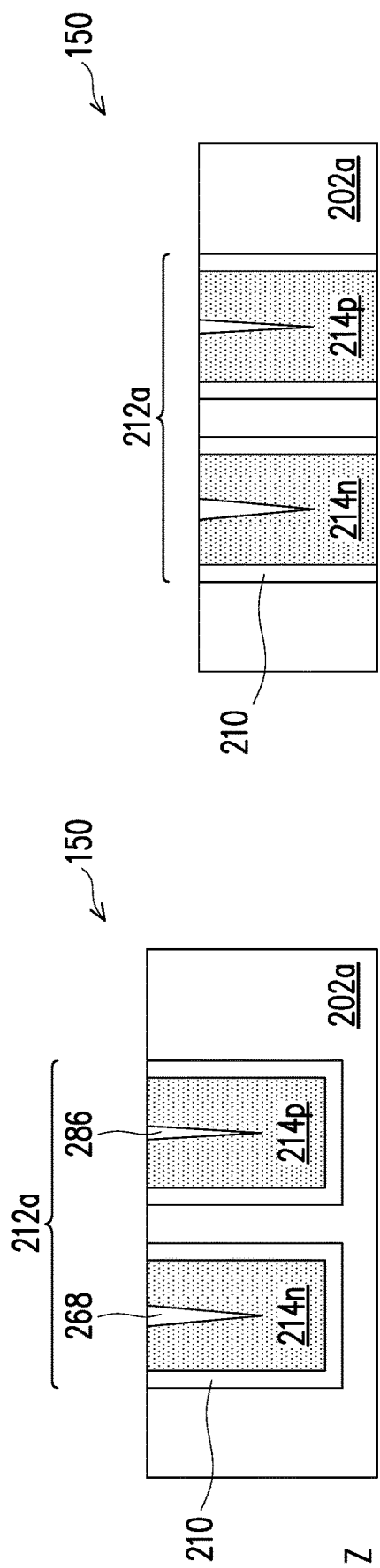

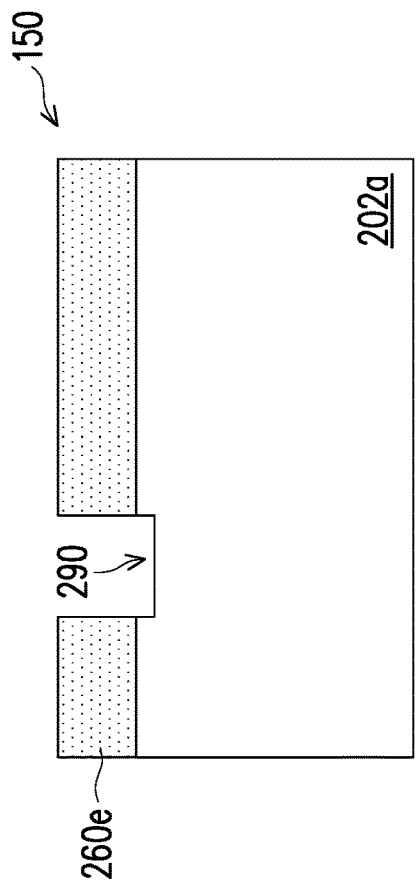
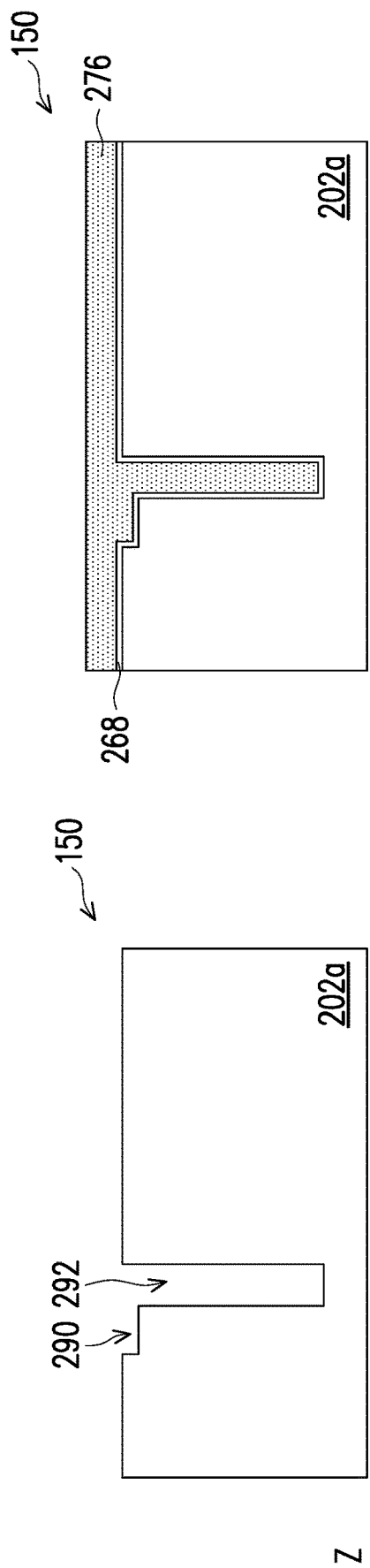

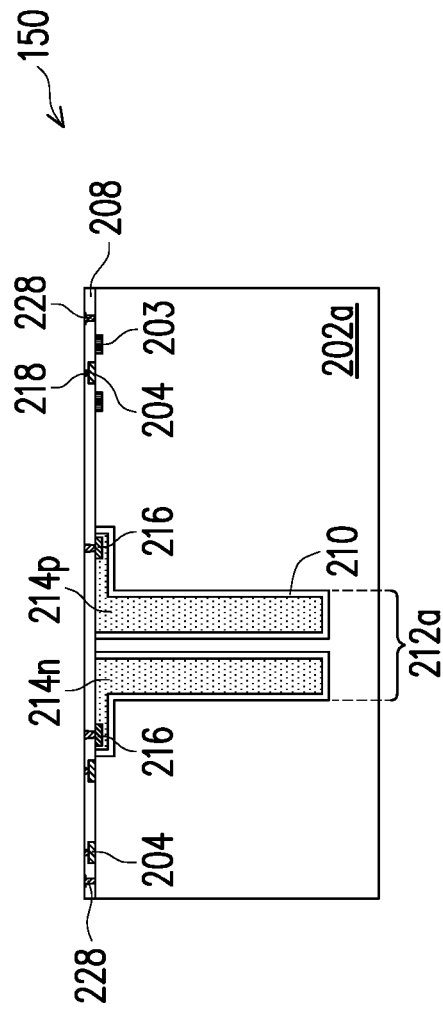
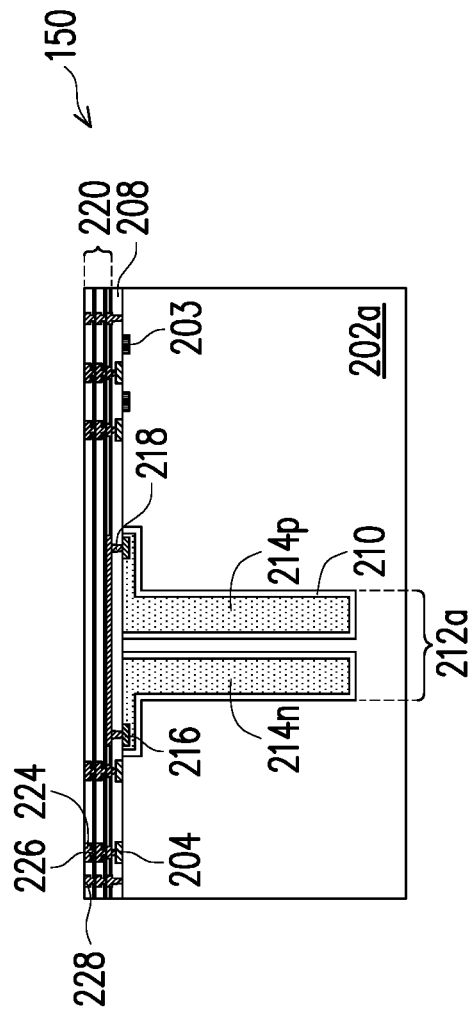
FIG. 16J
FIG. 16K

THERMOELECTRIC COOLING OF SEMICONDUCTOR DEVICES

CROSS-REFERENCE TO RELATED APPLICATIONS

This application claims the benefits to U.S. Provisional Application Ser. No. 63/232,774 filed Aug. 13, 2021, and titled "Chip Cooling by Thermoelectric Technology," the entire disclosure of which is incorporated herein by reference.

BACKGROUND

The semiconductor integrated circuitry (IC) industry has experienced rapid growth. Technological advances in IC design and material have produced generations of ICs where each generation has smaller and more complex circuits than previous generations. During the course of IC evolution, functional density (i.e., the number of interconnected devices per chip area) has generally increased while geometry size (i.e., the smallest component (or line) that can be created using a fabrication process) has decreased.

As the semiconductor device scaling down continues, challenges in fabrication may arise. For example, existing processes of cooling devices in an IC package have not been sufficiently simple and may rely on external cooling system to decrease its operating temperature. Therefore, although existing semiconductor fabrication methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 3A, 3B, 3C, 5A, 5B, 8A, 8B, 8C, 8D, 8E, 8F, 9A, 9B, 10E, 10F, 10G, and 10H are cross-sectional views of an example integrated chip package (or portions thereof) according to various aspects of the present disclosure.

FIGS. 4A, 4B, 6A, 6B, 7A, 7B, 7C, 7D, 10A 10B, 10C, and 10D are planar top views of the example integrated chip package (or portions thereof) according to various aspects of the present disclosure.

FIG. 11 is a flowchart of a method for fabricating an example integrated chip package according to various aspects of the present disclosure.

FIGS. 13A, 13B, 13C, 13D, 13E, 13F, and 13G are cross-sectional views of an example integrated chip package (or portions thereof) at intermediate stages of the method as depicted in FIGS. 11 and/or 12 according to various aspects of the present disclosure.

FIGS. 15A, 15B, 15C, 15D, 15E, 15F, 15G, 15H, 15I, 15J, and 15K are cross-sectional views of an example integrated chip package (or portions thereof) at intermediate stages of the method as depicted in FIGS. 11 and/or 14 according to various aspects of the present disclosure.

FIGS. 16A, 16B, 16C, 16D, 16E, 16F, 16G, 16H, 16I, 16J, 16K, 16L, 16M, 16N, 16O, 16P, 16Q, 16R, and 16S are cross-sectional views of an example integrated chip package (or portions thereof) at intermediate stages of the method as depicted in FIGS. 11 and/or 14 according to various aspects of the present disclosure.

DETAILED DESCRIPTION

Figure 1:
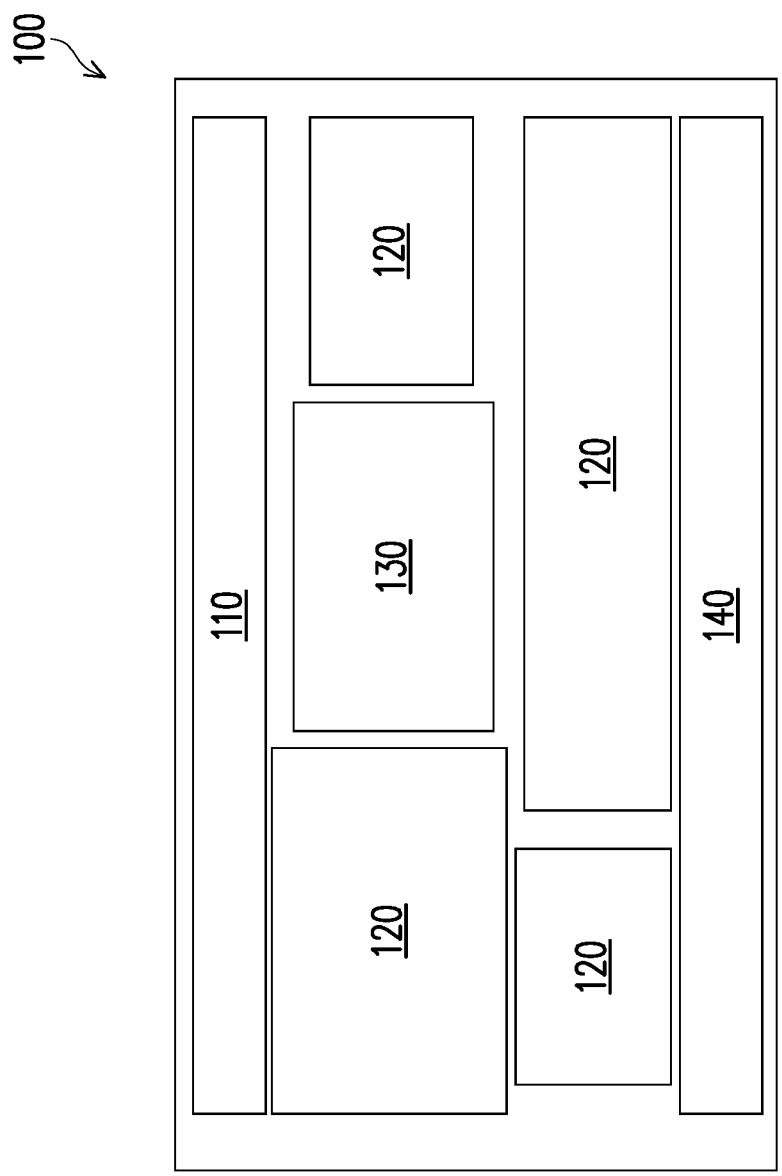
FIG. 1 is a schematic illustration of an example integrated chip package (or portions thereof) according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally directed to structures and methods of cooling semiconductor devices on an IC chip package. More specifically, the present disclosure is directed to internally cooling an IC chip package by utilizing thermoelectric-based modules (or devices) formed within the IC chip package. In some embodiments, the IC chip package may be formed in a system-on-integrated-chip (SoIC) configuration, a chip-on-wafer-on-substrate (CoWoS) configuration, an integrated fan-out (InFO) configuration, a three-dimensional Fabric (3DFabric) configuration, other configurations, or combinations thereof.

Referring to FIG. 1, an example IC chip package 100 is provided to include a variety of semiconductor devices, such as a memory controller 110, a plurality of core devices 120, a memory device (e.g., an L3 cache) 130, and other component 140, which may include an uncore device, a queue device, and/or an I/O device. Temperature of these and other devices of the package 100 may inadvertently increase during operation due to heat generation and resistance of various metal components (e.g., wires) may also increase. Due to differences in pattern densities, heat generated by various components of the IC chip package 100 may differ. In the present example, the core devices 120 may generate a greater amount of heat than other devices. Such rise in temperature may introduce adverse effects on the lifetime of dielectric components, such as gate oxide material. While existing chip cooling technologies have been generally adequate, they have not been entirely satisfactory in all aspects. As new generations of devices are developed, multiple chips may become integrated (via bonding, for example) to form a system with reduced footprint. In some instances, it may be desirable to incorporate cooling technology internally within the chip system instead of or in addition to utilizing an external cooling system. Furthermore, due to difference in the heat generated, it may be desirable to integrate thermal detector and relevant control circuit with the cooling technology to detect heating event(s) in the chip system and apply cooling in targeted areas where the heating event(s) occur.

Figure 2A:
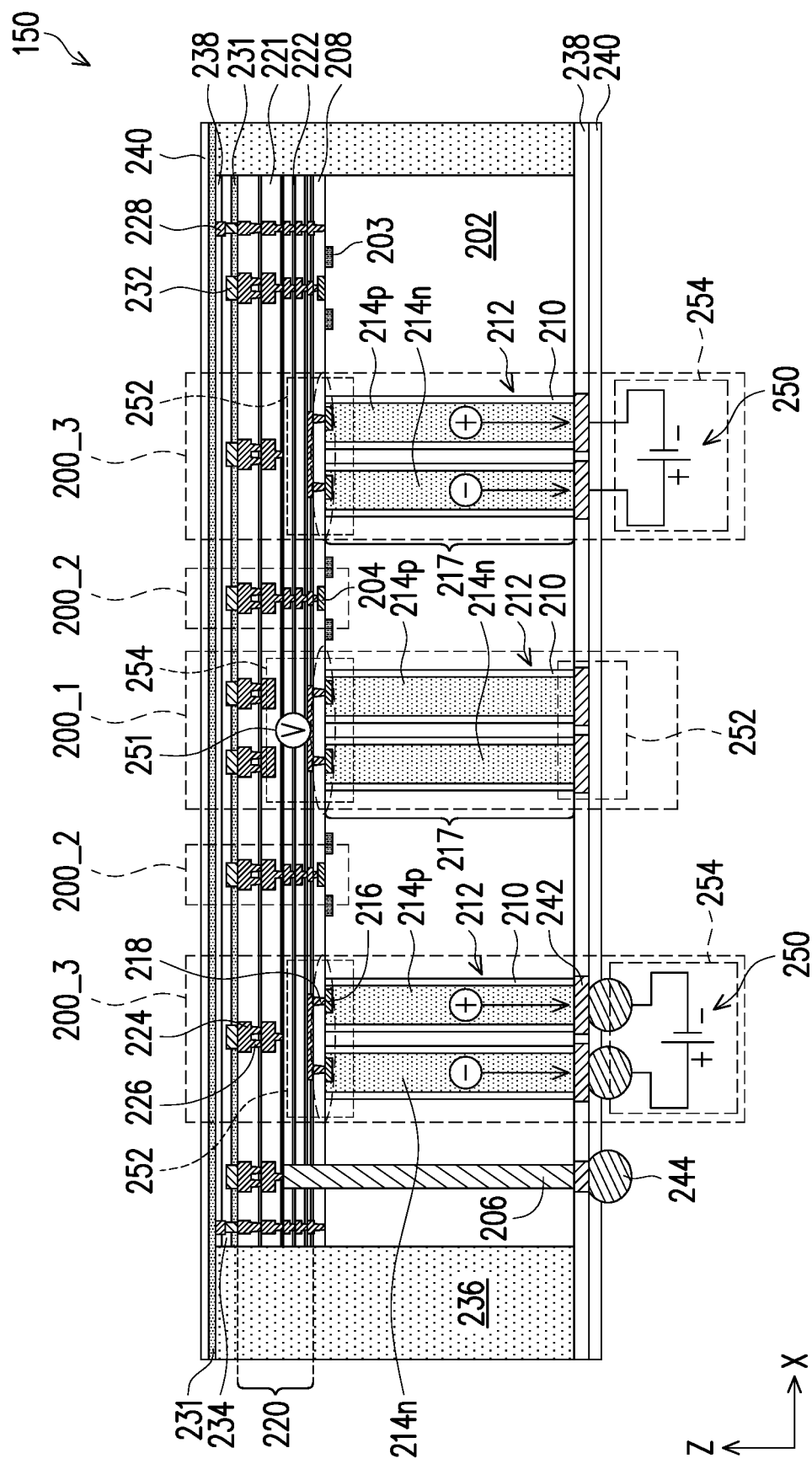

FIG. 2A illustrates a diagrammatic cross-sectional view of an IC device 150 in the XZ plane constructed according to various embodiments of the present disclosure. In some embodiments, the IC device 150 may be a portion of the IC chip package 100. In an example embodiment, the IC device 150 may include one or more core devices similar to the core devices 120 of the IC chip package 100.

In the present embodiments, the IC device 150 includes at least a thermal detector 200_1, a control circuit 200_2, and a heating/cooling device 200_3. In some embodiments, as depicted herein, the IC device 150 may include more than one of the thermal detector 200_1, the control circuit 200_2, and the heating/cooling device 200_3. In some embodiments, as depicted in FIG. 2A, the IC device 150 is formed (or provided) on a single chip over a substrate 202. In some embodiments, referring to FIG. 3B for example, the IC device 150 includes a top chip 200a integrated with a bottom chip 200b.

Referring to FIG. 2A, the substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

The substrate 202 may include various devices 204, such as field-effect transistors (FETs), memory cells, imaging sensors, passive devices, other devices, or combinations thereof, separated by isolation structures 203. In some embodiments, the devices 204 include planar FETs, multi-gate 3D FETs (e.g., FinFETs and nanosheet, or gate-all-around, FETs), other suitable FETs, or combinations thereof. Referring to FIG. 1, each device 204 may include a gate structure 205 engaging with an active region formed in or protruding from the substrate 202. In some embodiments, the substrate 202 further includes a through-silicon-via (TSV) 206 that extends partially or completely through a thickness of the substrate 202 to interconnect portions of the top chip 200a with the bottom chip 200b.

The isolation structures 203 may include a dielectric material, such as silicon oxide, tetraethylorthosilicate (TEOS), doped silicon oxide (borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation structures 203 may include shallow trench isolation (STI) features.

In the present embodiments, still referring to FIG. 2A, the IC device 150 further includes a multi-layer interconnection (MLI) structure 220 disposed over and electrically coupled to the devices 204 via device-level contacts 218 formed in an interlayer dielectric (ILD) layer 208. The ILD layer 208 may include silicon oxide, a low-k dielectric material, TEOS, a doped silicon oxide (e.g., BPSG, FSG, PSG, BSG, etc.), other suitable dielectric materials, or combinations thereof. The device-level contact 218 may include at least a bulk conductive layer disposed over a barrier layer, where the bulk conductive layer may include W, Cu, Ru, Co, Al, other suitable materials, or combinations thereof, and the barrier layer may include TiN, TaN, or a combination thereof.

The MLI structure 220 may include various interconnect features, such as conductive lines 224 and vias 226, disposed in dielectric layers, such as ILD layers 221 and etch-stop layers (ESLs) 222. In some embodiments, the vias 226 are vertical interconnect features configured to interconnect the device-level contact 218 with a conductive line 224 or to interconnect conductive lines 224, which are horizontal interconnect features, at various levels. The conductive lines 224 are distributed in multiple metal layers, such as a first metal layer (e.g., a M1 layer), a second metal layer (e.g., a M2 layer), and so on.

In some embodiments, the IC device 150 further includes conductive pads 232 disposed in a dielectric layer 234 and over the MLI structure 220. The conductive pads 232 may be configured to electrically couple the MLI structure 220 with additional conductive features during a packaging process. The conductive pads 232 may include any suitable material, such as Al.

In some embodiments, the IC device 150 further includes seal ring structures 228 surrounding portions of the IC device 150 to prevent stress and contaminants from adversely affecting circuits of the IC device 150 during a die-cutting process. The seal ring structures 228 may include a conductive material, such as Cu, disposed over a seed layer, and may be configured to extend through the MLI structure 220 to contact the substrate 202. The IC device 150 may include a passivation layer 231 disposed over the MLI structure 220 (e.g., over a topmost metal layer) and configured to provide isolation and protection to the underlying components of the IC device 150. In some embodiments, the passivation layer 231 includes silicon nitride (SiN), an un-doped silica glass (USG), or a combination thereof.

In addition, the IC device 150 may include multiple chips (e.g., the top chip 200a over the bottom chip 200b) to be packaged together in a desired configuration (e.g., SoIC, CoWoS, InFO, or combinations thereof). In this regard, a dielectric bonding film 238 may be formed over the MLI structure 220. The dielectric bonding film 238 may include any suitable material, such as silicon oxide ($SiO_2$). In some embodiments, the dielectric bonding film 238 provides an interface for a hybrid bonding process discussed in detail below. In some embodiments, bumps 244 are also formed over the packaging materials to electrically connect the top chip 200a to additional chip(s) or to an external power source (e.g., external power source 250). The bumps 244 may include, for example, controlled collapse chip connections, or C4, and/or micro bumps (μbumps), and may be electrically coupled to portions of the MLI structure 220 and/or the TSV 206 via a contact feature 242 that includes, for example, Cu. In some embodiments, the bumps 244 are configured to electrically couple portions of the IC device 150 with a packaging substrate, an interposer, a redistribution layer (RDL), other suitable components, or combinations thereof according to a desired packaging configuration. Still further, a dielectric layer (or a gap-fill layer) 236 may be formed along sidewalls of the substrate 202 to accommodate any dissimilarity in lateral dimension between two stacked chips of the IC device 150 during the packaging process. The dielectric layer 236 may include any suitable materials, such as TEOS, silicon oxide, a low-k dielectric material, other suitable materials, or combinations thereof.

In some embodiments, still referring to FIG. 2A, the IC device 150 further includes a thermoelectric module (or thermoelectric device; hereafter referred to as "module" for short) 212 that extends from a top surface of the substrate 202 to a bottom surface of the substrate 202. In the present embodiments, the module 212 is an integrated component of each of the thermal detector 200_1 and the heating/cooling device 200_3. In the present embodiments, the module 212 is embedded in the substrate 202.

With respect to the heating/cooling device 200_3, the module 212 may be electrically connected to an external power source 250 via the contact features 242 and the bumps 244. Alternatively, for embodiments in which the IC device 150 includes a stacked chip configuration (see FIG. 3B, for example), the module 212 (e.g., top module 212a) of the top chip (e.g., the top chip 200a) may be electrically connected to the module 212 (e.g., bottom module 212b) of the bottom chip (e.g., the bottom chip 200b) via the dielectric bonding film 238, the conductive pads 232, the MLI structure 220, and the device-level contacts 218 disposed between the substrate (e.g., substrate 202a) of the top chip 200a and the substrate (e.g., substrate 202b) of the bottom chip 200b. In the present embodiments, the heating/cooling device 200_3 is configured to transfer heat between two junctions of the module 212 when connected to the external power source 250.

With respect to the thermal detector 200_1, the module 212 may be electrically connected to a voltage sensor (e.g., a voltmeter) 251, which is configured to detect a temperature difference between two junctions of the module 212. The voltage sensor 251 may be connected to the module 212 of the thermal detector 200_1 in any suitable configuration.

The module 212 is configured as a thermoelectric device. In the present embodiments, the module 212 includes a pair of semiconductor structures, an n-type structure 214n and a p-type structure 214p, where the majority charge carriers in the n-type structure 214n are negatively charged (e.g., electrons) and the majority charge carriers in the p-type structure 214p are positively charged (e.g., holes). In the present embodiments, the module 212 is electrically and/or physically connected to the device-level contacts 218 via metal silicide layers 216. In some embodiments, a metal silicide layer (or silicide contact) 216 is formed over a top surface of each of the n-type structure 214n and the p-type structure 214p by first depositing a metal layer including, for example, cobalt, nickel, and/or other suitable metals, over the n-type structure 214n and the p-type structure 214p, applying a heat treatment to form metal silicide, and removing any unreacted metal layer to expose the metal silicide layer 216. In some embodiments, the metal silicide layer 216 may also be formed between the device-level contacts 218 and one or more of the devices 204.

In the present embodiments, the n-type structure 214n includes a semiconductor material doped with an n-type dopant and the p-type structure 214p includes a semiconductor material doped with a p-type dopant. The n-type structure 214n may include a semiconductor material such as Si, Ge, SiGe, other suitable materials, or combinations thereof, and the n-type dopant may include arsenic (As), phosphorus (P), other suitable dopants, or combinations thereof. The p-type structure 214p may include a semiconductor material such as Si, Ge, SiGe, other suitable materials, or combinations thereof, and the p-type dopant may include boron (B), gallium (Ga), indium (In), other suitable dopants, or combinations thereof. In some embodiments, the n-type structure 214n and the p-type structure 214p include the same semiconductor material but different dopants. For example, the n-type structure 214n and the p-type structure 214p may both include Si. In some embodiments, the n-type structure 214n and the p-type structure 214p include a semiconductor material that is the same as the composition of the substrate 202 (or 202b). In some embodiments, the n-type structure 214n and the p-type structure 214p include different semiconductor materials. For example, the n-type structure 214n may include Si doped with an n-type dopant and the p-type structure 214p may include SiGe doped with a p-type dopant. In the present embodiments, the concentration of each type of dopant in the n-type structure 214n and the p-type structure 214p is at least about $10^{17}$ $cm^{-3}$. In some embodiments, the concentration of each type of dopant is at least about $10^{19}$ $cm^3$. In some embodiments, if the concentration of charge carriers is less than about $10^{17}$ $cm^{-3}$, the amount of heat dissipated during the thermoelectric process is not sufficient to achieve the desired cooling effect of the IC device 150.

Figure 2C:
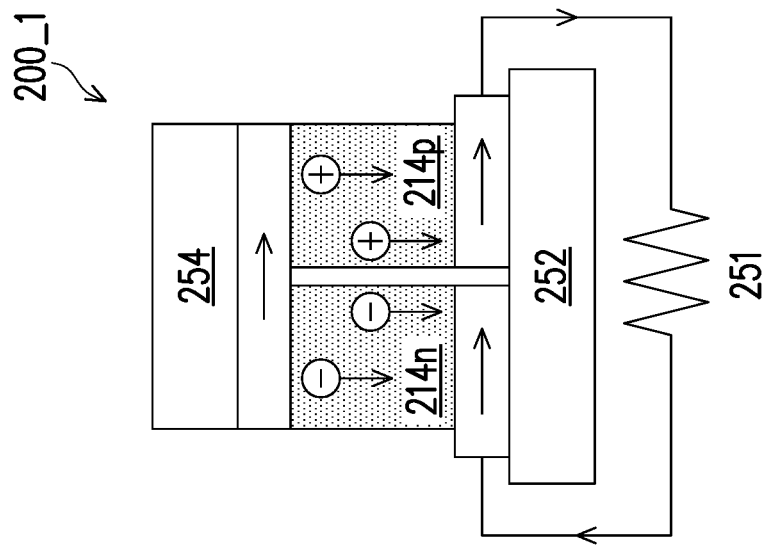
FIGS. 2B and 2C are schematic illustrations of operations of an example integrated chip package (or portions thereof) according to various aspects of the present disclosure.
Figure 2B:
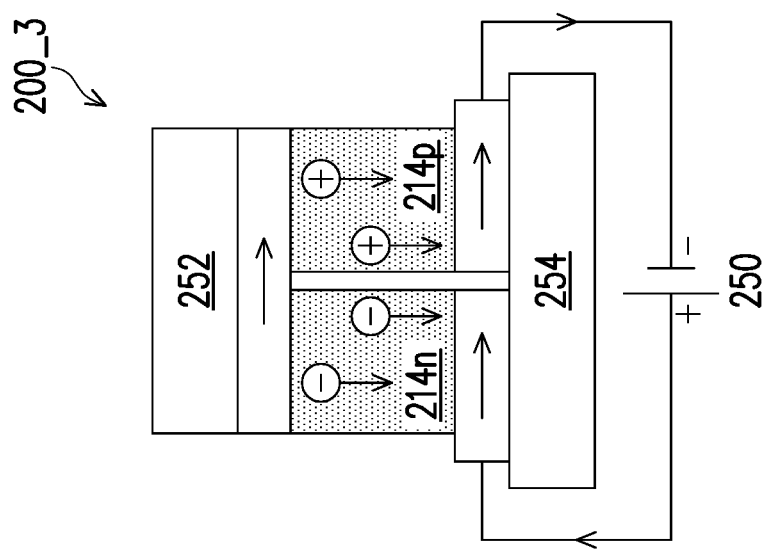

Referring to FIGS. 2A and 2B and with respect to the heating/cooling device 200_3, the module 212 provides internal cooling of the IC device 150 by the principle of the Peltier effect, which describes the transfer of heat from a first region 252 to a second region 254 at thermally conductive surfaces of two dissimilar materials, e.g., the n-type structure 214n and the p-type structure 214p, joined by thermally conductive surfaces on each end. In this regard, the n-type structure 214n and the p-type structure 214p are thermally connected in parallel and electrically connected in series to each other, such that when a direct current (DC) generated by the external power source 250 flows through the n-type structure 214n and the p-type structure 214p, a temperature differential is created between the thermally conductive surfaces. Specifically, according to the arrangement depicted in FIG. 2A, heat is transferred from the first region 252, which is near the top surface of the IC device 150, to the second region 254, which near the bottom surface of the substrate 202, thereby cooling circuit(s) disposed in the first region 252. In other words, the first region 252 becomes the relatively cooler region and the second region 254 becomes the relatively warmer region. In this regard, charge carriers in the module 212 move from the first region 252 toward the second region 254 as indicated in FIG. 2A. While the present disclosure is generally directed to methods of cooling components of the IC device 150, the heating/cooling device 200_3 may also be implemented to heat components of the IC device 150 to suitable temperatures for operation in freezing or otherwise frigid environment, e.g., polar environment. In this regard, the components of the IC device 150 needing to be heated by the heating/cooling device 200_3 would be situated in the second region 254.

Referring to FIGS. 2A and 2C and with respect to the thermal detector 200_1, the module 212 is configured to sense a difference in temperature (ΔT) between two thermally conductive surfaces of the thermal detector 200_1 according to principle of the Seebeck effect. Specifically, the ΔT between the first region 252 and the second region 254 produces a difference in potential (ΔV) in an open circuit. By connecting the module 212 with the voltage sensor 251, the ΔV may be measured. In this regard, the module 212 functions as a temperature-sensing thermocouple.

Figure 2D:
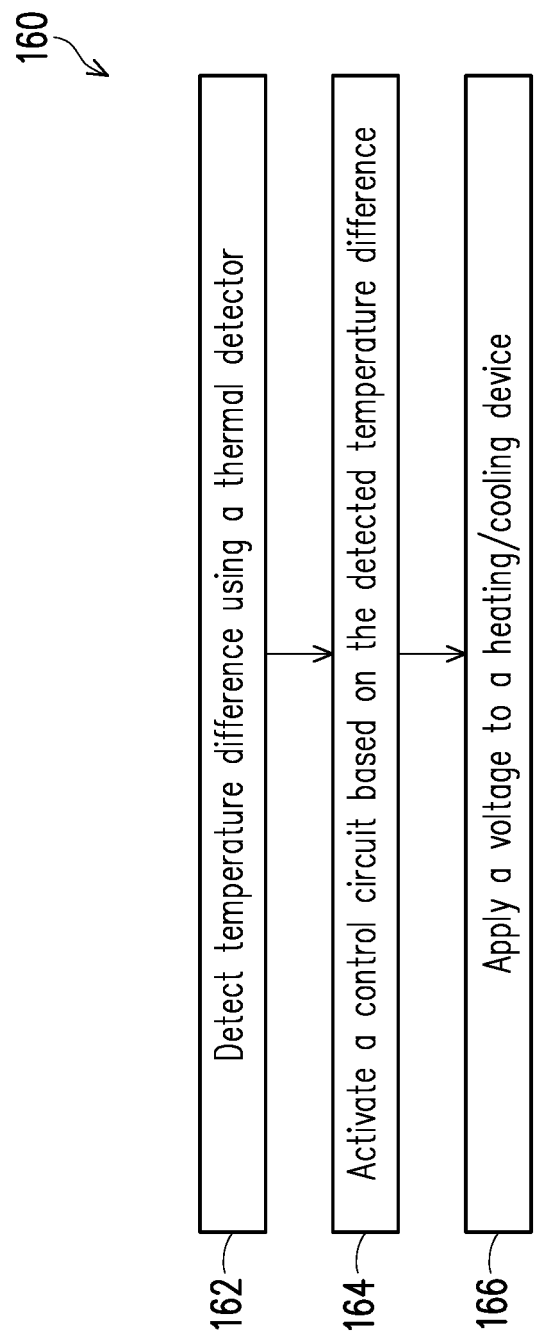
FIG. 2D is a flowchart of a method for using an example integrated chip package (or portions thereof) according to various aspects of the present disclosure.

FIG. 2D depicts an example embodiment of method 160 for using the IC device 150. At operation 162, the thermal detector 200_1 senses an increase in temperature ΔT in one or more regions (e.g., the first region 252) of the IC device 150 due to heat generated during operation. At operation 164, if the change in temperature exceeds a threshold for the IC device 150 (or a portion thereof), which may be determined based on specific design requirement, method 160 activates the control circuit 200_2. Subsequently, at operation 166 the control circuit 200_2 applies a voltage, which provided by the external power source 250, for example, to the heating/cooling device 200_3 to remove the heat via the thermoelectric mechanism (e.g., the Peltier effect) from the first region 252 where functional devices are located.

FIGS. 3A-10H depict various embodiments of the IC device 150 (or a portion thereof). Unless designated specifically, the module 212 (e.g., the top module 212a and the bottom module 212b) may be a component of the thermal detector 200_1 or a component of the heating/cooling device 200_3.

Figure 3A:
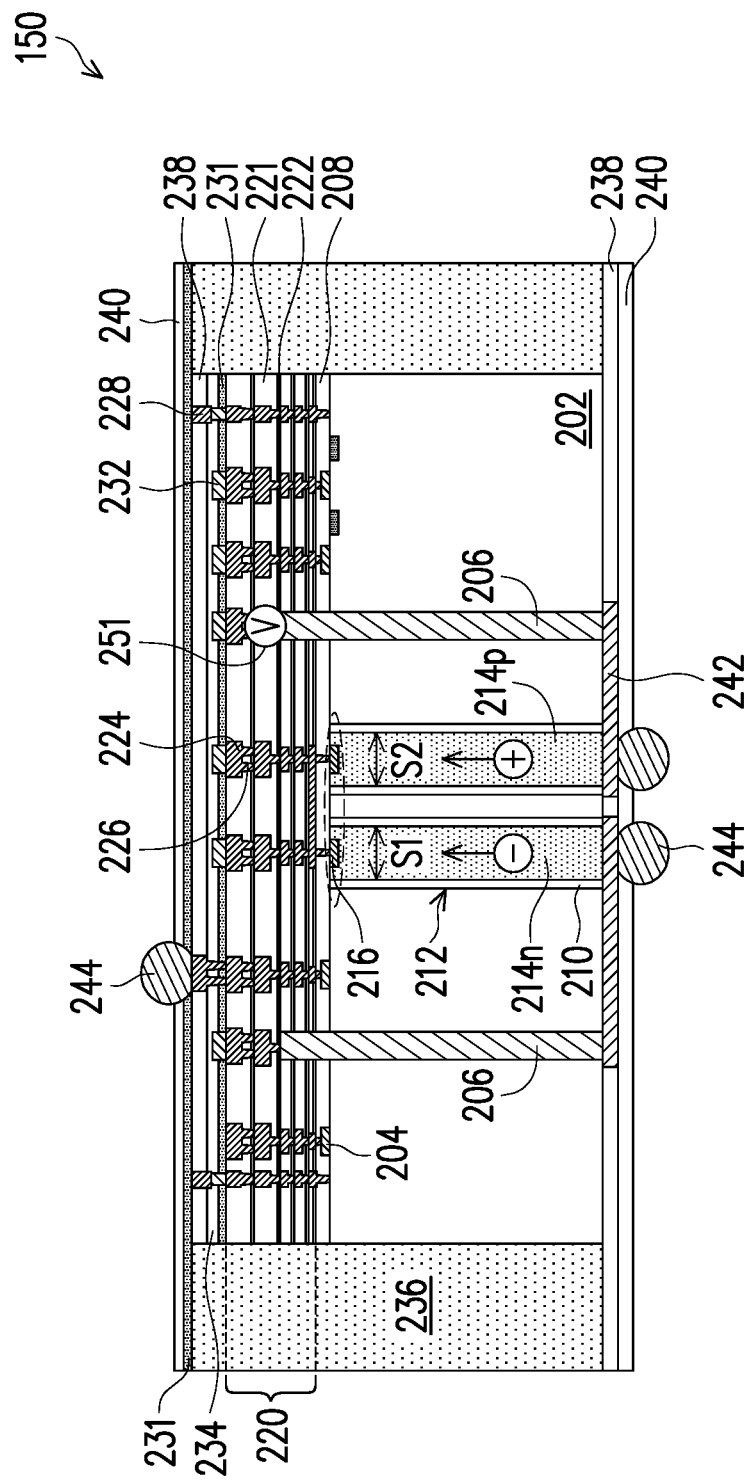

FIG. 3A depicts an example embodiment of the IC device 150. FIG. 3A is substantially similar to FIG. 2A, except that it illustrates an alternative configuration by which the voltage sensor 251 is connected to the module 212. In this regard, the voltage sensor 251 may be connected to the module 212 via the contact features 242 and the TSV 206. In some embodiments, the module 212 may be electrically connected to the voltage sensor 251 via the TSV 206 to form the thermal detector 200_1. In some embodiments, the module 212 may be electrically connected to an external power source (not depicted in FIG. 3A) via the TSV 206 to form the heating/cooling device 200_3.

In some embodiments, referring to FIG. 3B, the IC device 150 includes the top chip (or a top die) 200a on a substrate 202 bonded to the bottom chip (or bottom die) 200b on a substrate 202b, resulting in a stacked chip IC device 150. The embodiment depicted in FIG. 3B may be substantially similar to one or both of the top chip 200a and the bottom chip 200b. Accordingly, components commonly depicted in FIGS. 2A and 3B are described using the reference numerals with the letters "a" or "b" added to denote whether the top chip 200a or the bottom chip 200b is referenced.

In the present embodiments, the top chip 200a and the bottom chip 200b are vertically stacked and directly bonded to each other at an interface in a 3D integrated package design. In some embodiments, as depicted herein, the top chip 200a is bonded to the bottom chip 200b in a back-to-face configuration. In some embodiments, the top chip 200a and the bottom chip 200b are bonded in a face-to-face configuration. The IC device 150 may be portion of a SoIC configuration, a CoWoS configuration, an InFO configuration, other suitable 3D packaging configurations, or combinations thereof. In some embodiments, the top chip 200a and the bottom chip 200b are bonded by a hybrid bonding process. The hybrid bonding process may be implemented by fusing the dielectric bonding film 238 of a bottom surface of the top chip 200a with the dielectric bonding film 238 of a top surface of a bottom chip 200b and fusing exposed metal surfaces of the bottom surface of the top chip 200a with exposed dielectric elements of the top surface of the bottom chip 200b. An example hybrid bonding process may include a plurality of chemical mechanical polishing (CMP) steps to provide highly flat bonding surfaces, cleaning steps to clean the bonding surfaces (including dielectric surfaces and metal surfaces), surface activation steps to activate the bonding surfaces, a wafer-to-wafer alignment step and an annealing/bonding step.

Still referring to FIG. 3B, the top chip 200a and the bottom chip 200b may include similar components. For example, both the top chip 200a and the bottom chip 200b may include a substrate 202a/202b, a module 212a/212b, a plurality of devices 204 disposed over and/or in the substrate 202b, an MLI structure 220 disposed over and electrically coupled to the devices 204 via device-level contacts 218, and a passivation layer 231 disposed over the MLI structure 220. The bottom chip 200b may further include a plurality of conductive pads 232 embedded in one or more dielectric bonding film 238 to electrically couple portions (e.g., a TSV 206 and the MLI 220) of the bottom chip 220b to portions of the top chip 200a via the hybrid bonding process described above. Additional and/or alternative bonding materials may also be utilized according to various embodiments of the present disclosure. For example, interposers and/or bumps, such as the bumps 244, may be utilized to bond the top chip 200a to the bottom chip 200b, another chip, and/or a packaging substrate.

In some embodiments, the top module 212a extends from a top surface of the substrate 202a to a bottom surface of the substrate 202a and contacts a top portion of the bottom chip 200b, and the bottom module 212b that extends from a top surface of the substrate 202b to a bottom surface of the substrate 202b. In the depicted embodiments, the top module 212a and the bottom module 212g are electrically connected via the dielectric bonding film 238, the conductive pads 232, the MLI structure 220, and the device-level contacts 218. Furthermore, the top module 212a and the bottom module 212b may be connected to an external power source 250 via the contact features 242 and the bumps 244. In the present embodiments, the top module 212a and the bottom module 212b are embedded in the substrate 202 and the substrate 202b, respectively.

Figure 3C:
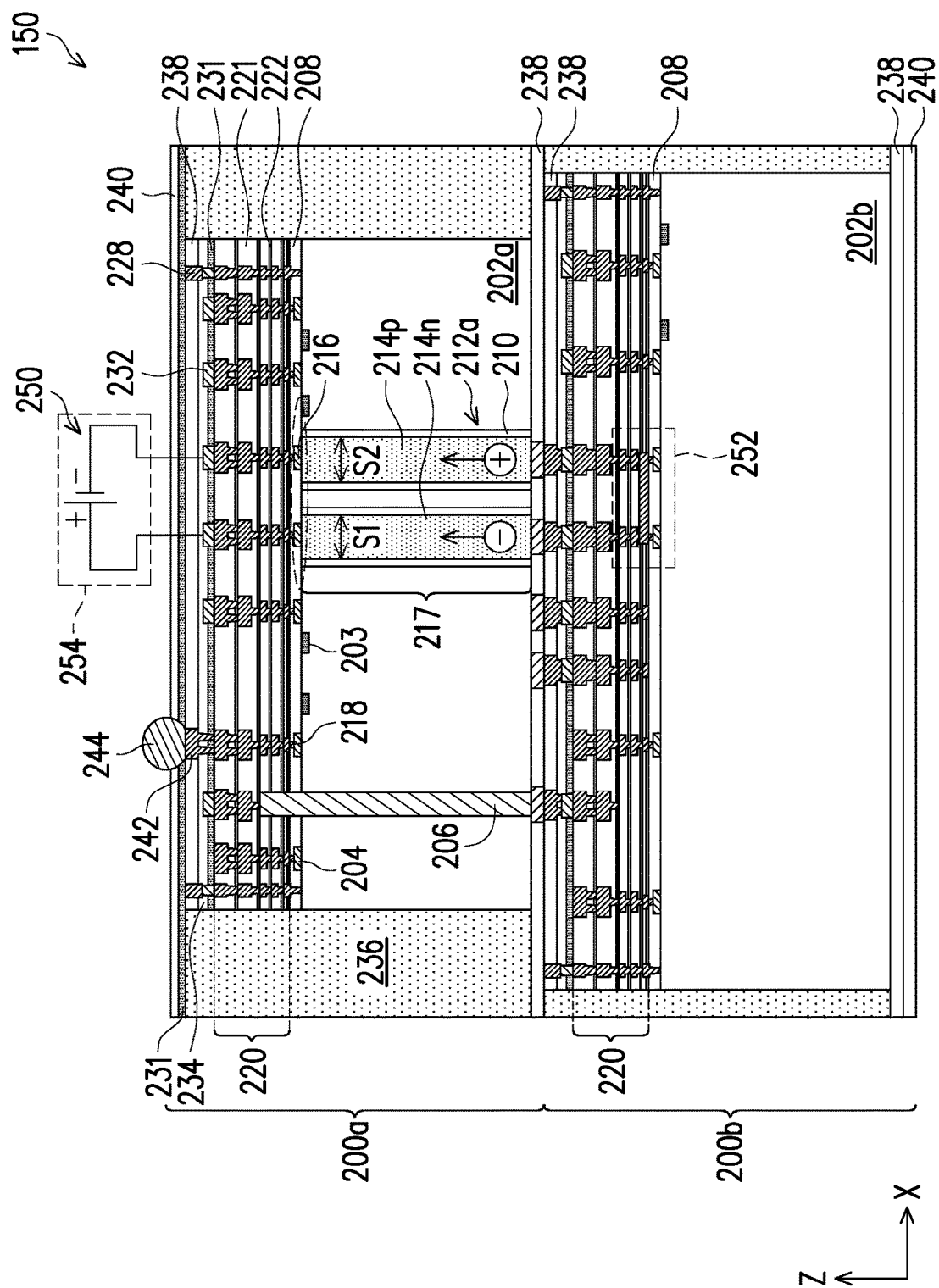

In some embodiments, referring to FIG. 3C, the IC device 150 includes the top module 212a embedded in the substrate 202a but does not include the bottom module 212b embedded in the substrate 202b as depicted in FIG. 3A. In this regard, the top module 212a is electrically connected to the external power source 250 through the MLI 220 of the top chip 200a, rather than through the bottom chip 200b. Accordingly, the charge carriers' movement is opposite to that depicted in FIGS. 2A and 3A-3B, and the first region 252 from which heat is removed is disposed within the bottom chip 200b. In some embodiments, the first region 252 depicted in FIG. 3C includes at least a portion of the MLI 220 and the devices 204 of the bottom chip 200b.

Figure 4A:
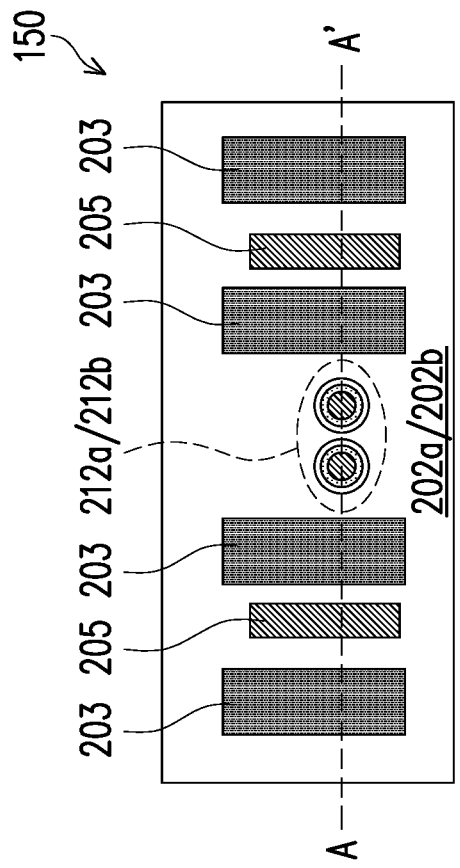
Figure 4B:
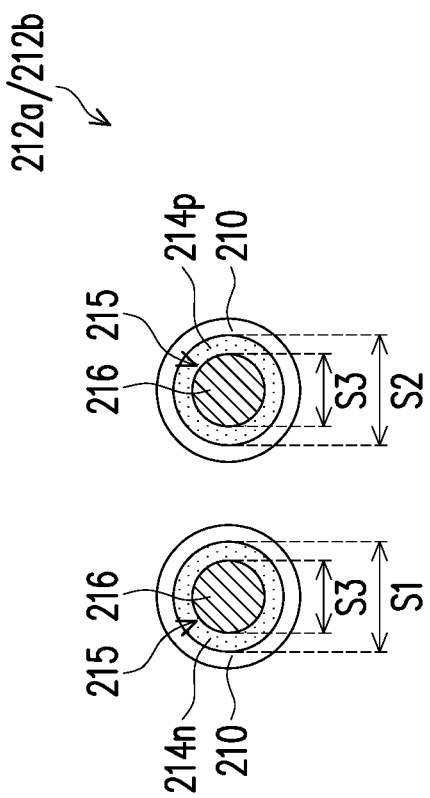

FIG. 4A illustrates a planar top view of a portion of the IC device 150 enclosed in a dashed oval in the XY plane as depicted in FIGS. 2A and 3A-3C, and FIG. 4B illustrates the top module 212a (or the bottom module 212b) in greater detail. A top portion 215 of the top module 212a (or the bottom module 212b) extends across a top surface of the substrate 202 (or the substrate 202b) and is disposed between isolation structures 203 and gate structure 205 (or other components of the devices 204). In the present embodiments, the n-type structure 214n and the p-type structure 214p are surrounded by a dielectric liner 210 configured to electrically separate (or isolate) each structure from the substrate 202 (or the substrate 202b). The dielectric liner 210 may include any suitable material, such as silicon oxide ($SiO_2$). In the present embodiments, the metal silicide layer 216 is disposed over each of the n-type structure 214n and the p-type structure 214p. In some embodiments, the metal silicide layer 216 is surrounded by each of the n-type structure 214n and the p-type structure 214p. In some examples, the metal silicide layer 216 may be configured with a substantially circular shape. The metal silicide layer may include at suitable material, such as cobalt silicide (CoSi), nickel silicide (NiSi), other suitable materials, or combinations thereof.

The top portion 215 of the n-type structure 214n and the p-type structure 214p may be formed to different configurations to accommodate various design requirements. In some embodiments, referring to FIG. 4B, the top portions 215 of the n-type structure 214n and the p-type structure 214p are each configured with a substantially circular shape. In the depicted embodiments, the top portion 215 of the n-type structure 214n is defined by a diameter S1 and the top portion 215 of the p-type structure 214p is defined by a diameter S2, where the diameter S1 may be substantially the same as or different from the diameter S2. In the present embodiments, the metal silicide layer 216 is configured with a diameter S3 that is less than the diameters S1 and S2. In some embodiments, sidewalls of a bottom portion 217 of each of the n-type structure 214n and the p-type structure 214p as depicted in FIGS. 2A and 3A-3C are substantially vertical, such that the width of the bottom portion 217 of each of the n-type structure 214n and the p-type structure 214p is defined by the diameters S1 and S2, respectively.

Figure 5A:
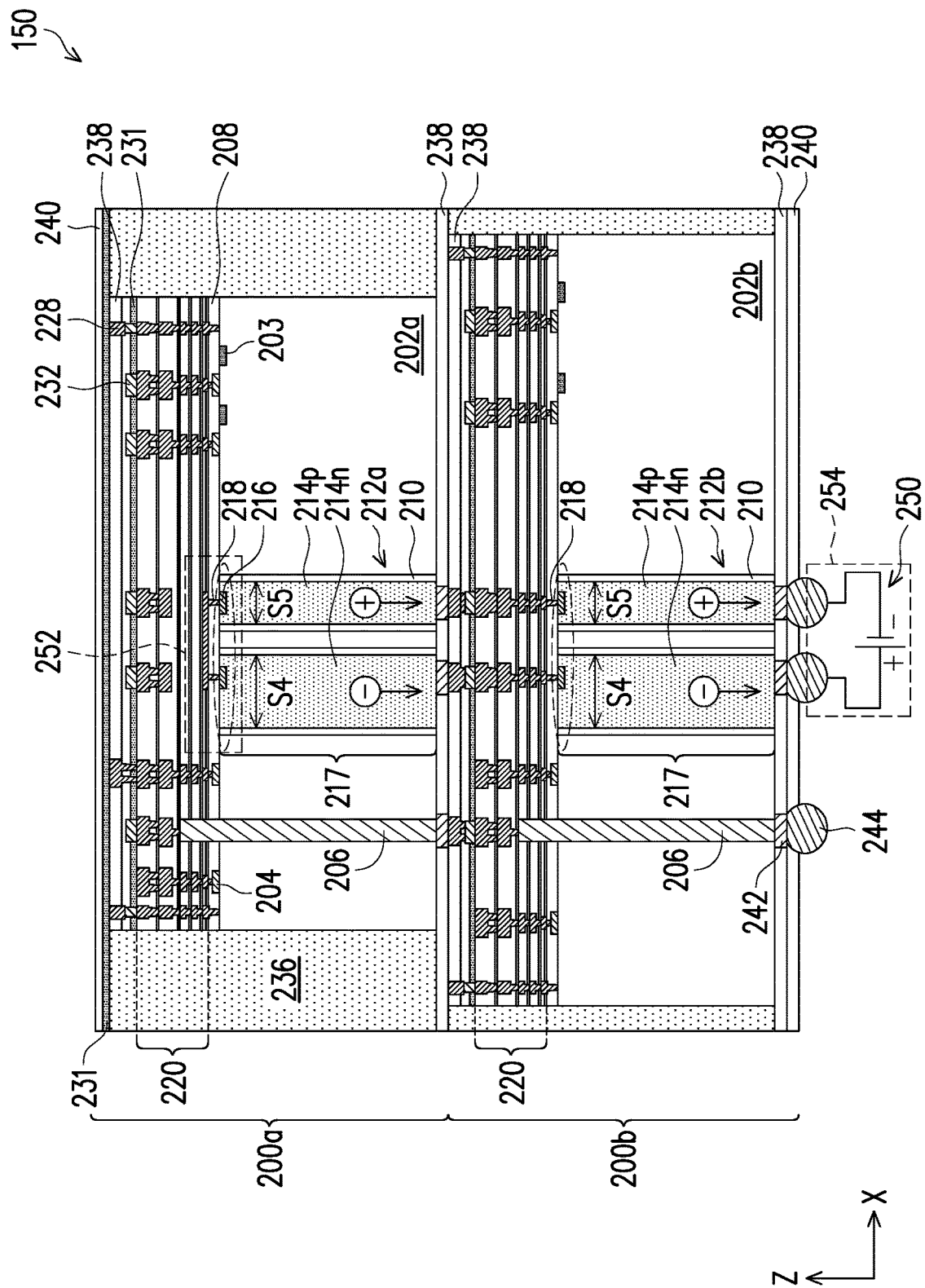
Figure 5B:
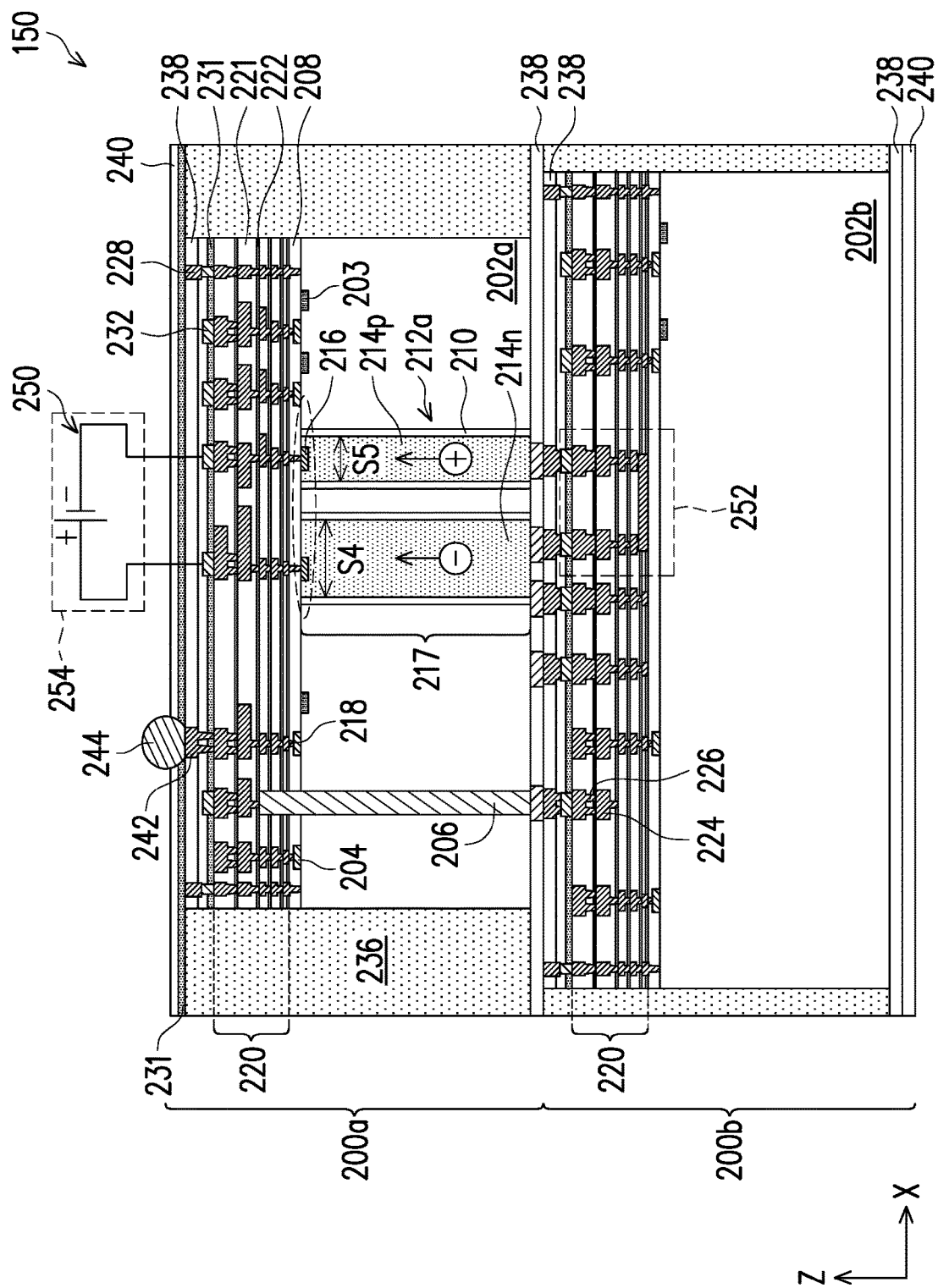
Figure 6A:
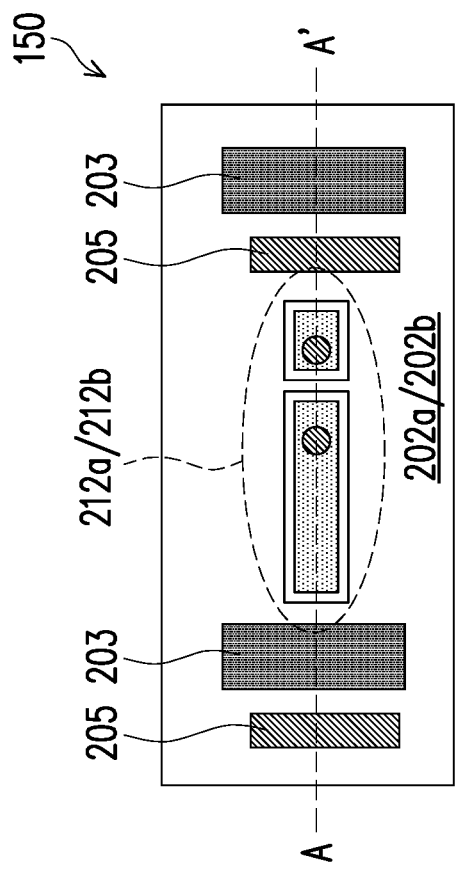
Figure 6B:
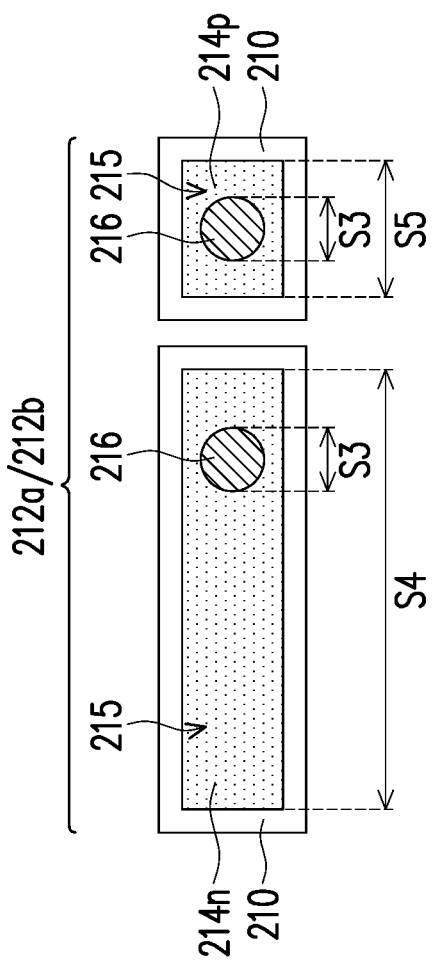
Figure 7C:
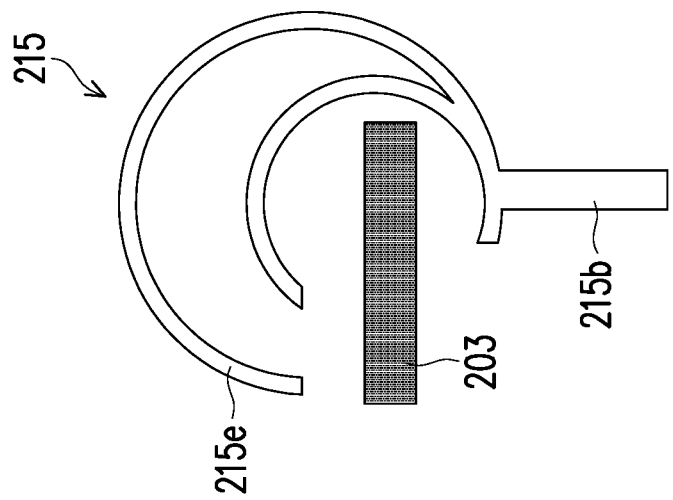
Figure 7D:
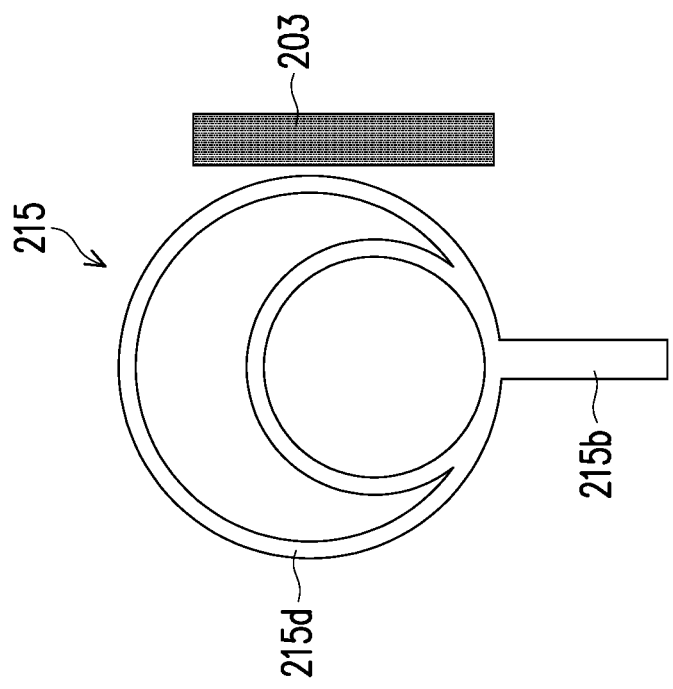

In some embodiments, referring to FIGS. 5A-5B and 6A-6B, which illustrate embodiments alternative to those depicted in FIGS. 2A, 3A-3C, and 4A-4B, the top portions 215 of the n-type structure 214n and the p-type structure 214p are each configured with a substantially elongated shape, i.e., having one dimension substantially greater than another. In some embodiments, referring to FIGS. 6A-6B, the top portions 215 of the n-type structure 214n and the p-type structure 214p are each configured with a rectangular shape oriented lengthwise along the X axis. In the depicted embodiments, the top portion 215 of the n-type structure 214n is defined by a length S4 and the top portion 215 of the p-type structure 214p is defined by a length S5, where the length S4 may be substantially the same as or different from the length S5. As depicted herein, the length S4 is greater than the length S5. In the present embodiments, diameter S3 of the metal silicide layer 216 is less than the lengths S4 and S5. For embodiments in which the sidewalls of the bottom portion 217 of each of the n-type structure 214n and the p-type structure 214p as depicted in FIGS. 5A-5B are substantially vertical, the width of the bottom portion 217 of each of the n-type structure 214n and the p-type structure 214p is defined by the lengths S4 and S5, respectively. In some embodiments, the elongated shape increases the conductive area of the module 212, thereby lowering its resistance and increasing its cooling effect.

Referring collectively to FIGS. 7A-7D, in addition to the circular and elongated shapes depicted in FIGS. 2A, 3A-3C, and 4A-6B, the top portion 215 of each of the n-type structure 214n and the p-type structure 214p may be formed to other configurations in a planar top view (i.e., in the XY plane) for purposes of increasing effective thermoelectric detection area. In some embodiments, each of the n-type structure 214n and the p-type structure 214p extends laterally across the top surface of the substrate 202a (or the substrate 202b). In some embodiments, referring to FIGS. 7A and 7B, the n-type structure 214n and/or the p-type structure 214p include segments 215a that are substantially aligned lengthwise along the X axis. In some embodiments, referring to FIGS. 7A-7D, the n-type structure 214n and/or the p-type structure 214p include segments 215b that are substantially aligned lengthwise along the Y axis. In some embodiments, referring to FIG. 7A, the n-type structure 214n and/or the p-type structure 214p include segments 215c that are oriented at an angle with respect to the X axis or the Y axis. In some embodiments, referring to FIG. 7C, the n-type structure 214n and/or the p-type structure 214p include segments 215d having substantially ring-shaped structures. In some embodiments, referring to FIG. 7D, the n-type structure 214n and/or the p-type structure 214p include segments 215e having substantially arc-shaped structures. In some embodiments, widths of the various segments of the n-type structure 214n and/or the p-type structure 214p are different. In further embodiments, the n-type structure 214n and the p-type structure 214p need not to have the same or symmetric structures for the thermoelectric effect to be realized. Still further, the isolation structure 203 may be disposed outside the top portion 215 (e.g., see FIGS. 7A and 7C) and/or between segments of the top portion 215 (e.g., see FIGS. 7A, 7B, and 7D).

Figure 8A:
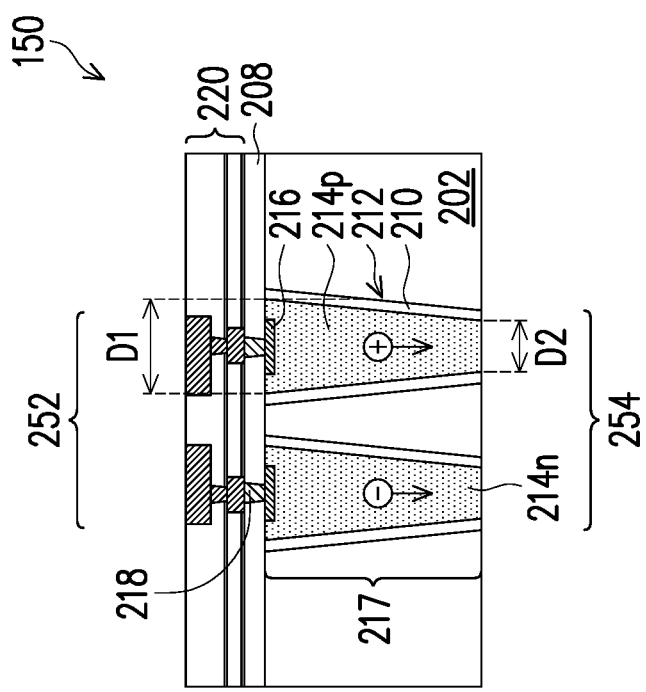
Figure 8B:
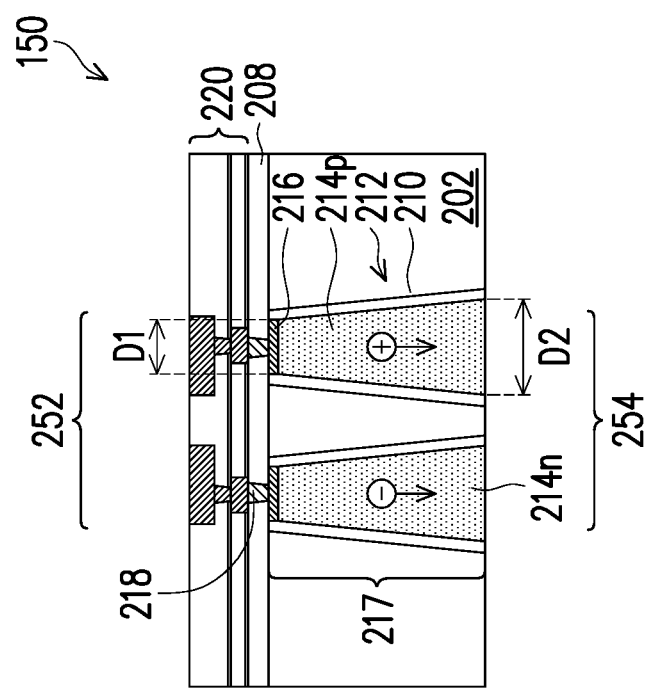
Figure 8C:
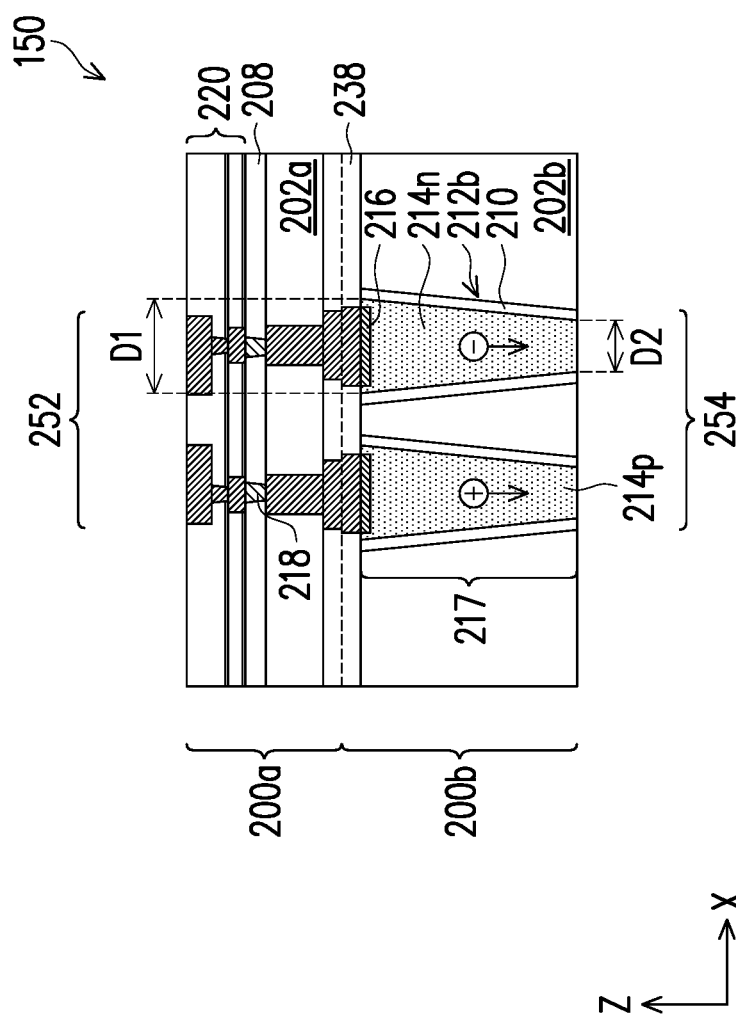
Figure 8D:
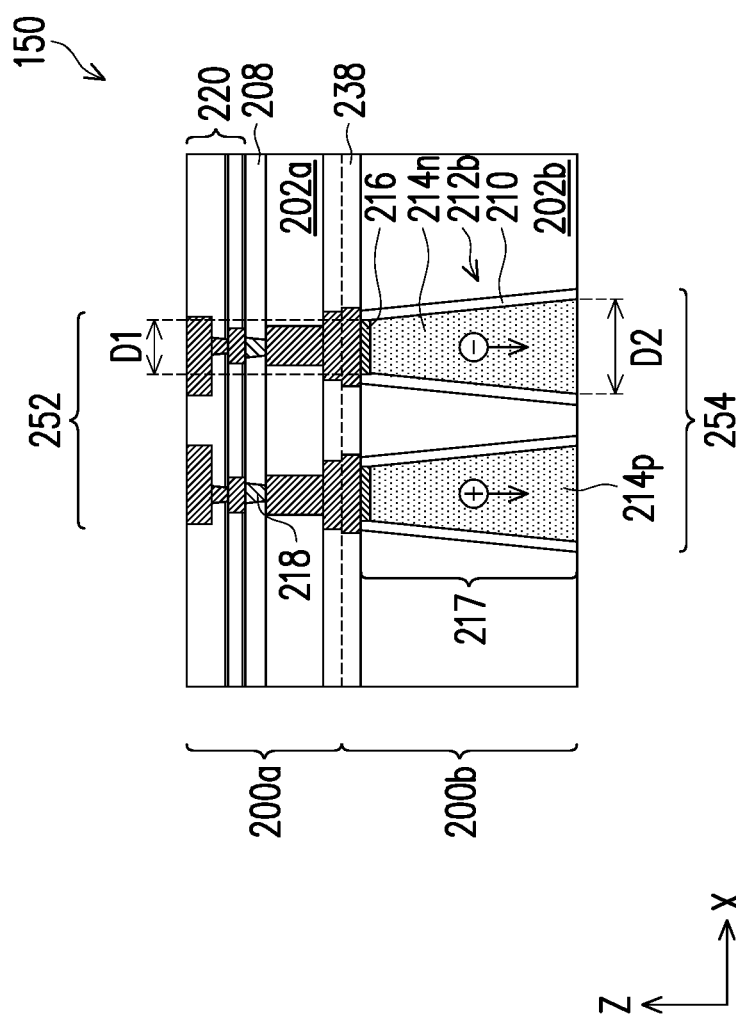
Figure 8E:
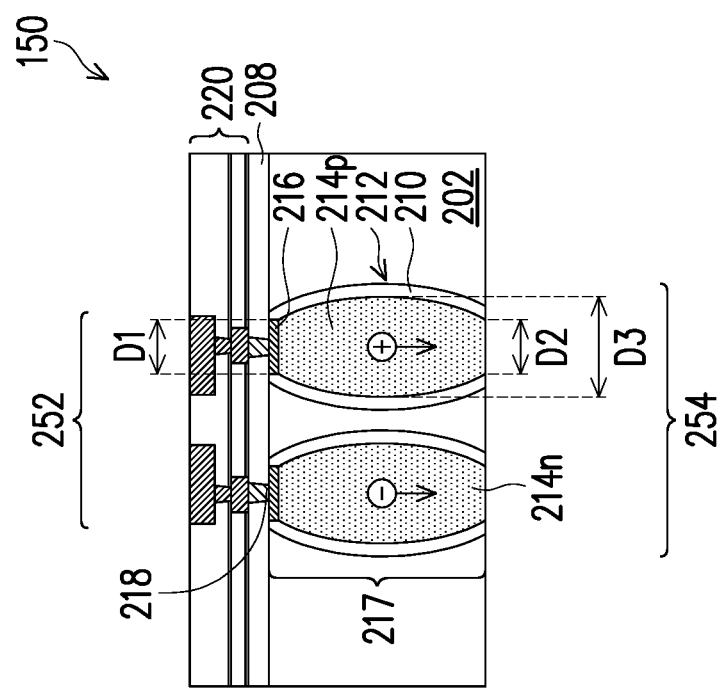
Figure 8F:
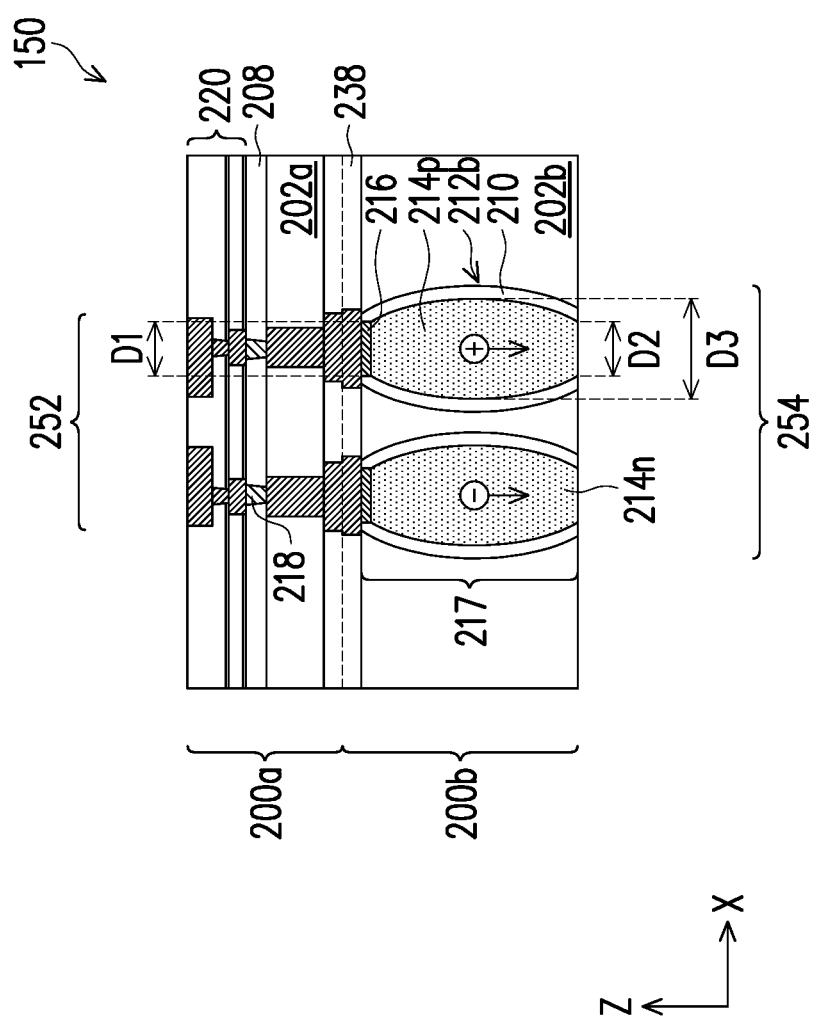

Referring to FIGS. 8A-8F, which each illustrate a portion of the IC device 150 having the module 212 embedded in the substrate 202; of which, FIGS. 8A, 8B, and 8E depict embodiments in which the IC device 150 includes a single substrate, similar to the embodiments depicted in FIGS. 2A and 3A, for example, and FIGS. 8C, 8D, and 8F depict embodiments in which the IC device 150 includes a stacked structure, similar to the embodiment depicted in FIG. 3B, except that only the bottom chip 200b includes the module 212 (i.e., the bottom module 212b) and the top chip 200a does not include the module 212 (i.e., the top module 212a). As depicted herein, the heat generated by the circuitry in the first region 252 during operation is dissipated by the module 212 and collected at or near the second region 254, thereby directly cooling the circuitry disposed in the first region 252 over the top surface of the module 212. In other words, the charge carriers move in a direction away from the first region 252 toward the second region 254.

Moreover, FIGS. 8A-8F each illustrate an example embodiment in which the bottom portion 217 of each of the n-type structure 214n and the p-type structure 214p is configured to have a shape different from a rectangle (or substantially rectangle) shape, such as that depicted in FIGS. 2A and 3A-3C.

FIGS. 8A-8D each depict an embodiment in which the sidewalls are straight but slanted, such that each of the n-type structure 214n and the p-type structure 214p is configured to have a trapezoidal (or substantially trapezoidal) shape. Referring to FIG. 8A, a top surface and a bottom surface of each of the n-type structure 214n and the p-type structure 214p are defined by a width D1 and a width D2, respectively, along the X axis, where the width D1 is greater than the width D2. In some non-limiting examples, a ratio of D2/D1 may be about 0.7 to about 0.9, such as about 0.8. FIG. 8B is similar to FIG. 8A, except that the width D1 is less than the width D2. In some non-limiting examples, a ratio of D1/D2 may be about 0.7 to about 0.9, such as about 0.8. FIGS. 8C and 8D, each illustrating the IC device 150 having a stacked configuration, correspond to their single-substrate counterparts depicted in FIGS. 8A and 8B, respectively.

FIGS. 8E and 8F each depict an embodiment in which the sidewalls are curved. Referring to FIG. 8E, a top surface and a bottom surface of each of the n-type structure 214n and the p-type structure 214p are defined by the width D1 and the width D2, respectively, and a center portion of each of the n-type structure 214n and the p-type structure 214p is defined by a width D3 that is greater than both the widths D1 and D2, such that each of the n-type structure 214n and the p-type structure 214p is configured to have a barrel-like shape. The present disclosure does not limit the relative dimensions of the widths D1 and D2. For example, the width D1 may be greater than, equal to, or less than the width D2. FIG. 8F is similar to FIG. 8E, except that the IC device has a stacked configuration with the module 212 (i.e., the bottom module 212b) being embedded in the bottom chip 200b and the top chip 200a is free of the module 212.

For embodiments in which the width D1 is greater than the width D2 (see FIGS. 8A and 8C), an area of the first region 252 being cooled by the module 212 (or the bottom module 212b) is increased, thereby improving the overall effect of cooling. For embodiments in which the width D1 is less than the width D2 (see FIGS. 8B and 8D), an area occupied by the top surface of the module 212 is reduced, thereby enlarging the space available for accommodating additional circuitry.

Figure 9A:
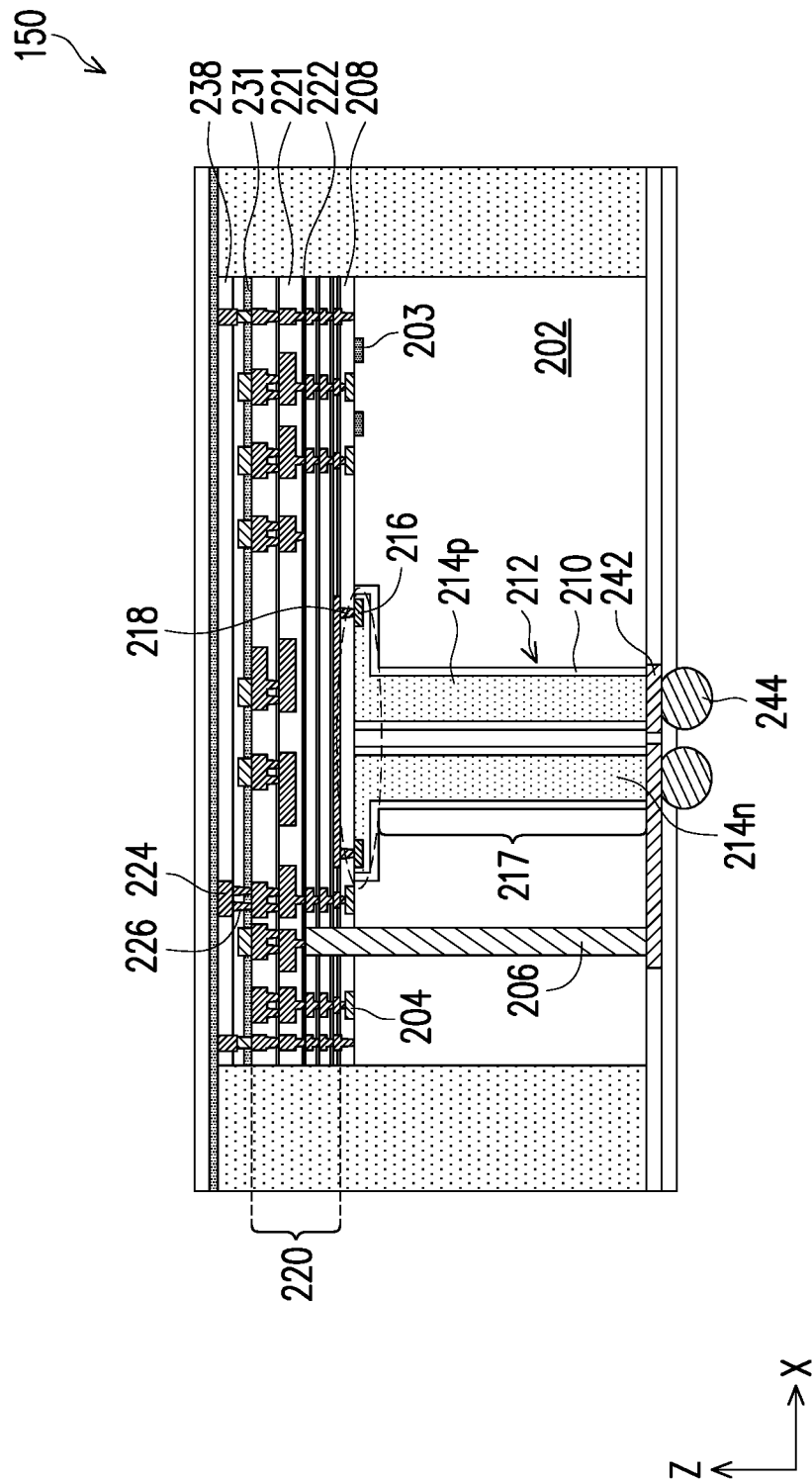
Figure 9B:
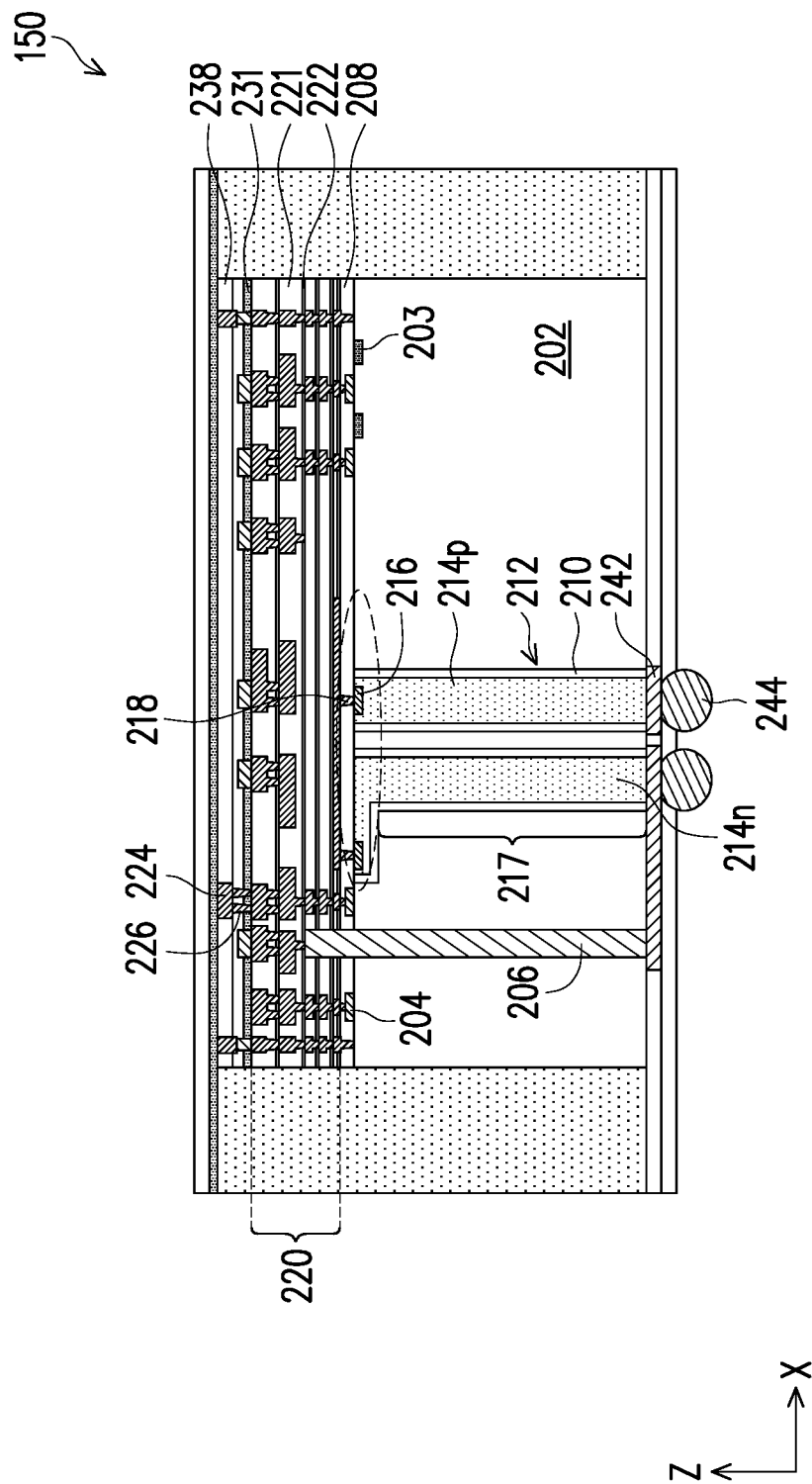

Referring to FIGS. 9A and 9B, the top portion 215 (enclosed by the dashed oval) of the n-type structure 214n and the p-type structure 214p may extend across the XY plane. FIGS. 10A-10D each illustrate a planar top view of the top portion 215 in the XY plane according to various embodiments; FIG. 10E illustrates a cross-sectional view of the IC device 150 along line BB' of FIG. 10A; FIG. 10F illustrates a cross-sectional view of the IC device 150 along line CC' of FIG. 10A; and FIGS. 10G and 10H each illustrate a cross-sectional view of the IC device 150 along line DD' of FIG. 10A. Although only one chip is depicted, features discussed here may be applicable to the stacked configurations.

Figure 10A:
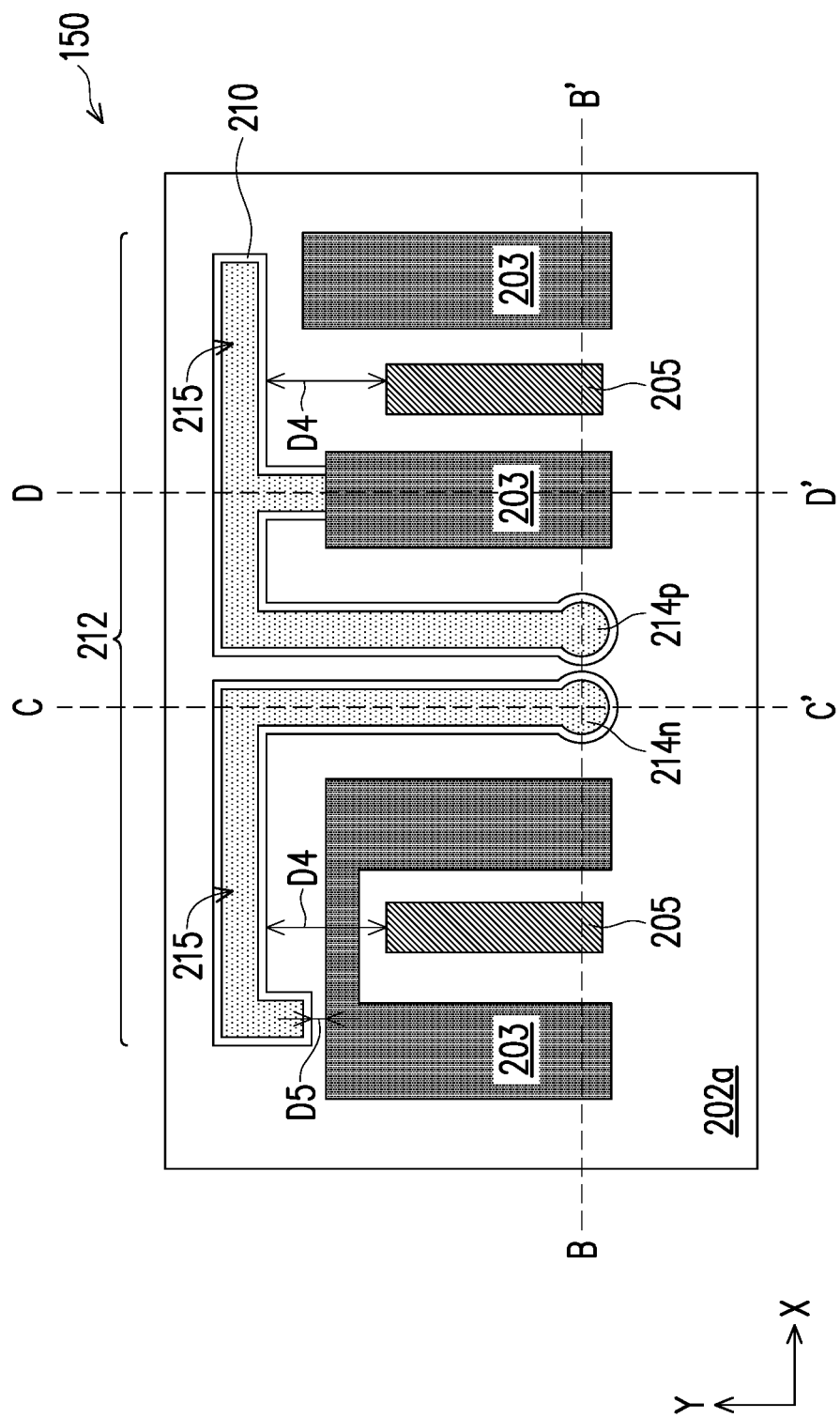
Figure 10B:
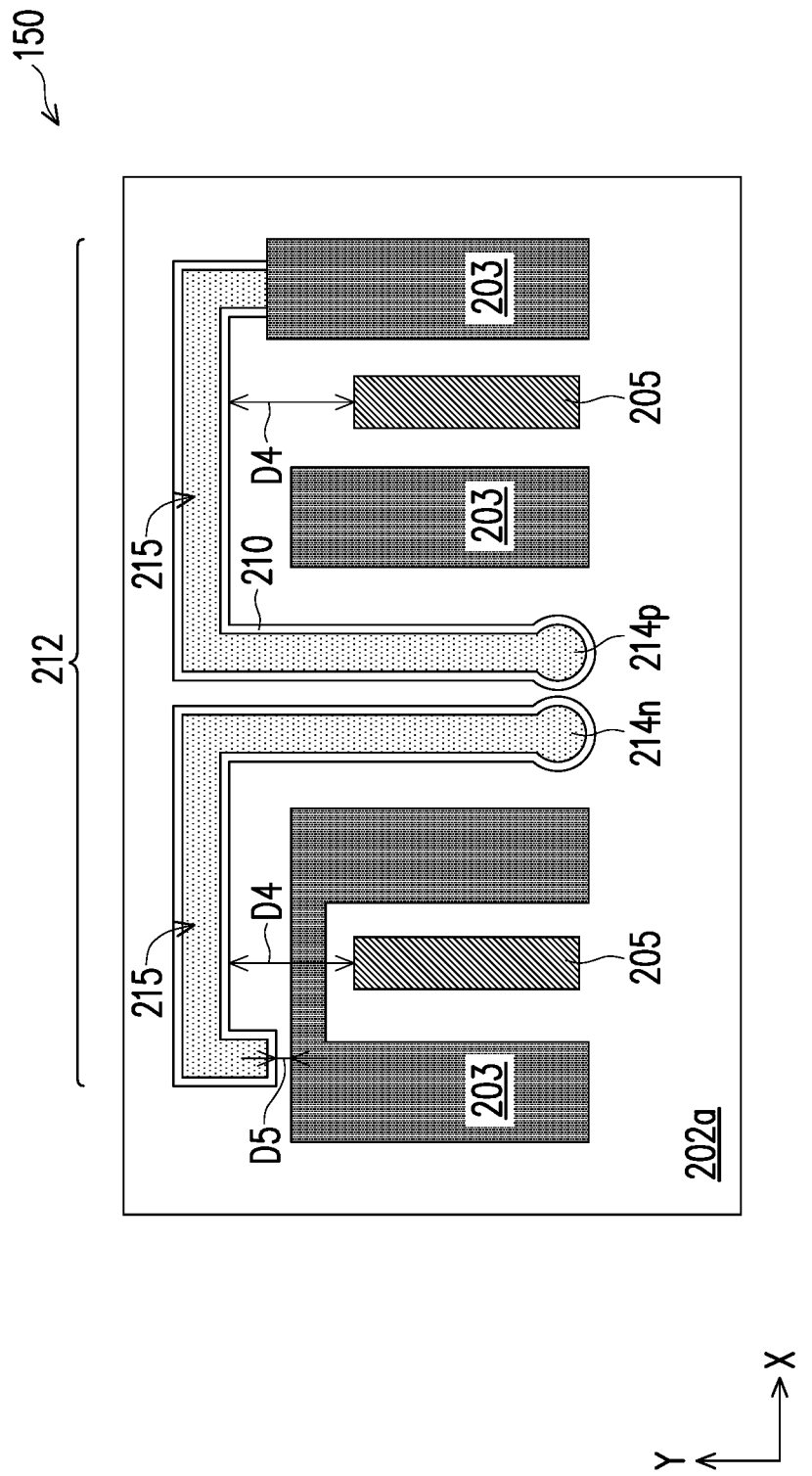
Figure 10C:
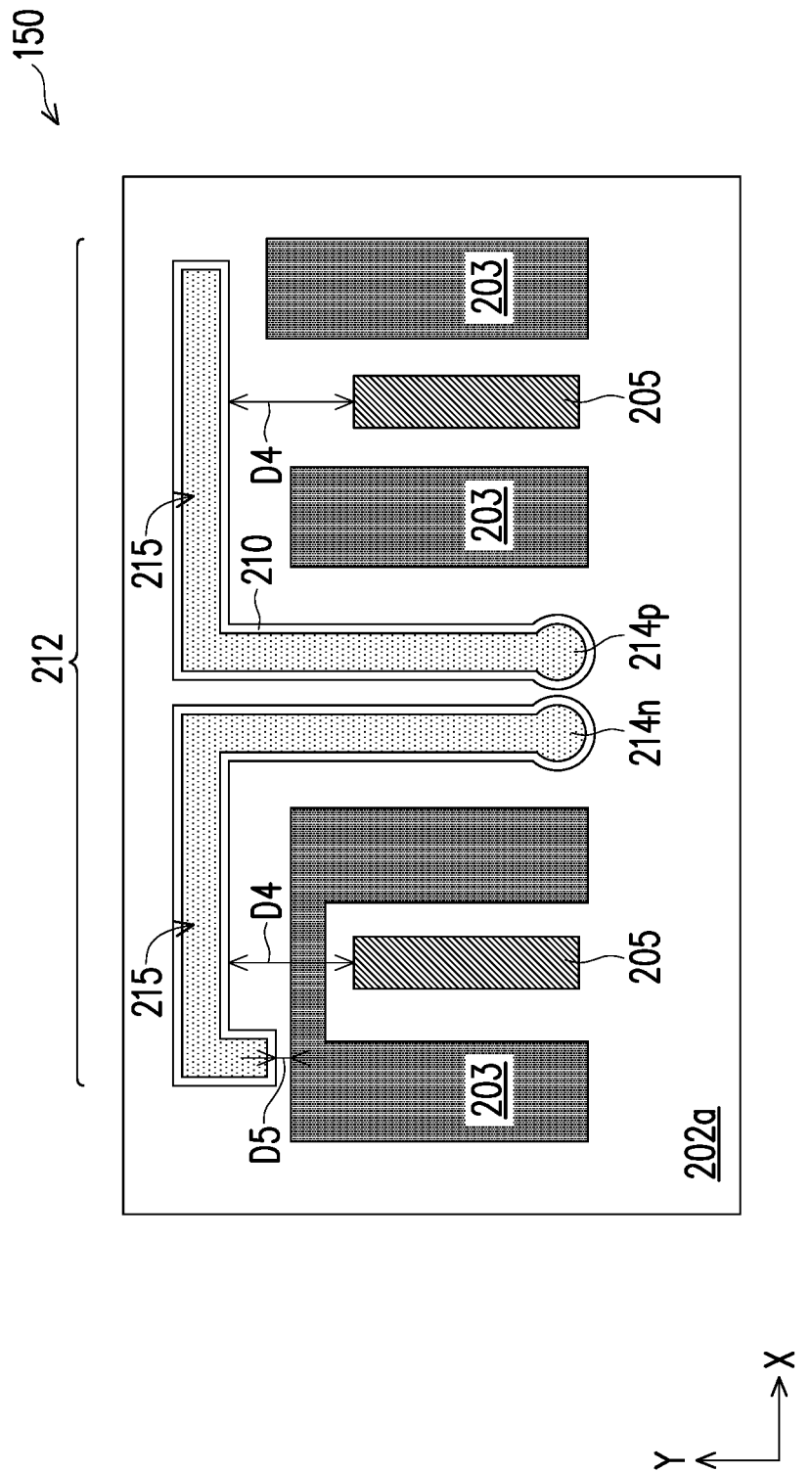

Referring to FIGS. 9A and 10A, each of the n-type structure 214n and the p-type structure 214p of the top module 212a includes segments that extend along the X axis and along the Y axis, respectively, in a line pattern across the top surface of the substrate 202. It is noted that the configurations of the top portions 215 of the n-type structure 214n and the p-type structure 214p are not necessarily identical. In the depicted embodiments, portions of the n-type structure 214n and the p-type structure 214p are disposed between the isolation structures 203 and the gate structure 205. In some embodiments, portions of the top module 212a are physically separated from the gate structure 205 (or other portions of the devices 204) by a distance D4 to avoid causing electric field interference when a voltage is applied to the top module 212a. In some examples, the distance D4 may be at least about 0.5 Furthermore, portions of the top module 212a may be separated from the isolation structures 203 by a distance D5, though the distance D5 is not limited in the present disclosure. In some examples, the distance D5 may be greater than 0 In some examples, the distance D5 may be about 0 i.e., the module 212 is in direct contact with the isolation structures 203. FIG. 10B is an alternative embodiment of FIG. 10A, where a portion of the p-type structure 214p extends to contact a different portion of the isolation structures 203 and the top portions 215 of the n-type structure 214n and the p-type structure 214p are substantially symmetric about the Y axis. FIG. 10C is another alternative embodiment of FIG. 10A, where the p-type structure 214p is free of contact with the isolation structures 203.

Figure 10D:
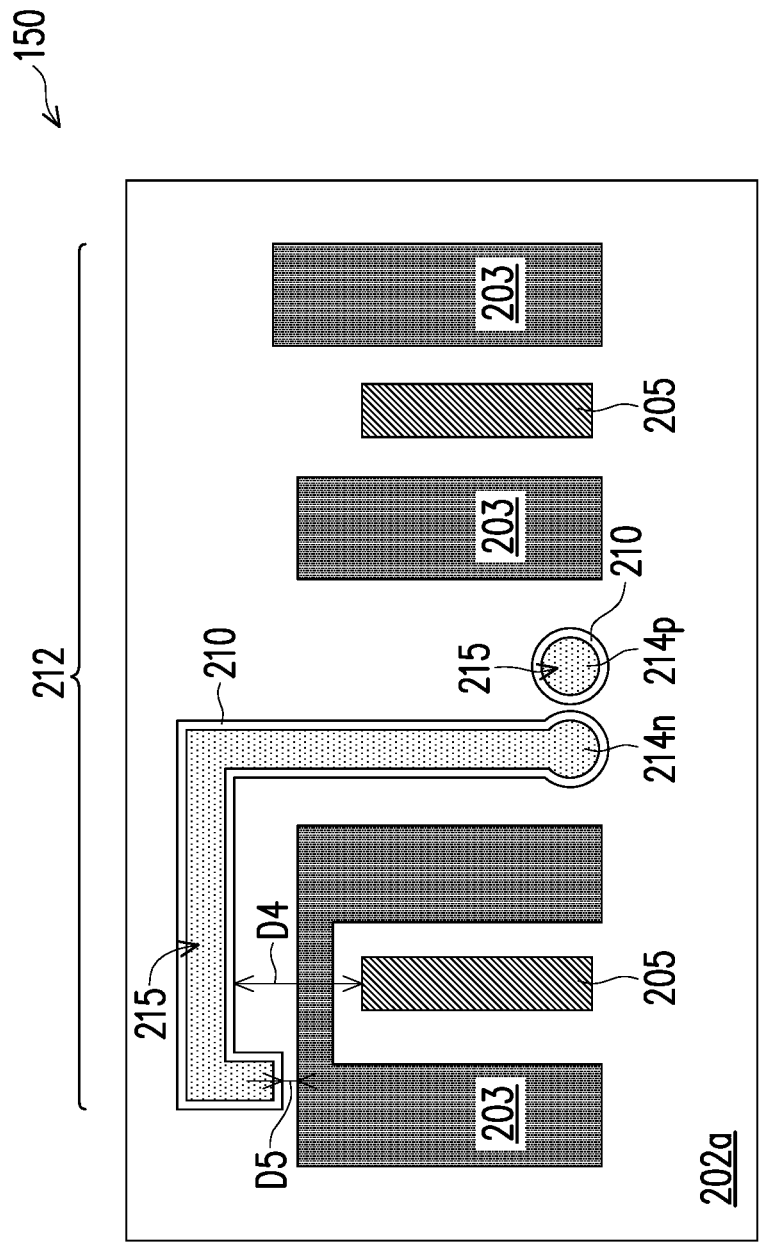
Figure 10E:
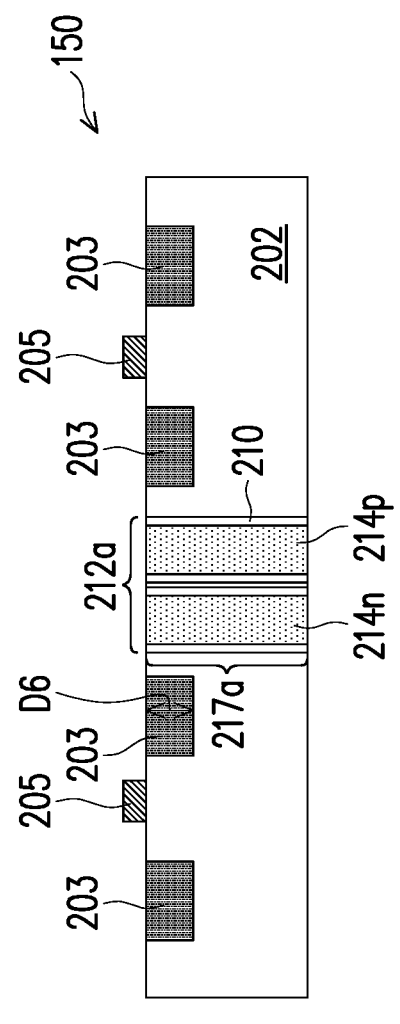
Figure 10F:
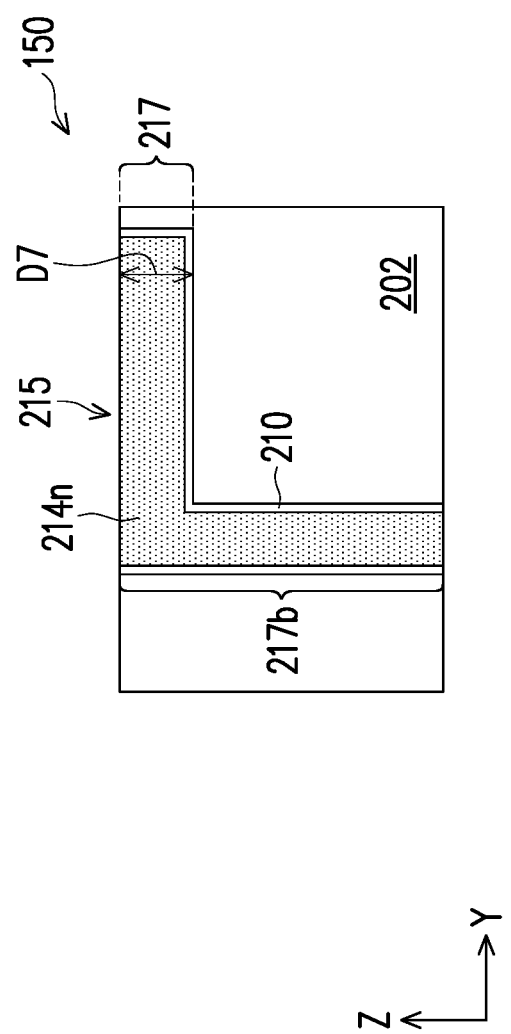

Referring to FIGS. 9B and 10D, the top portion 215 of the n-type structure 214n extends along the XY plane in a line pattern, while the top portion 215 of the p-type structure 214p is configured as a circular area. In other words, the top portion 215 of the p-type structure 214p does not partially surround the isolation structures 203 and/or the gate structure 205 ad doe the top portions 215 of both the n-type structure 214n and the p-type structure 214p as depicted in FIGS. 9A and 10A-10C.

Referring to FIG. 10E, a bottom portion 217a of the module 212 extends vertically along the Z axis through a thickness of the substrate 202, while the isolation structures 203 only partially penetrate the substrate 202 by a depth D6 that is less than the thickness of the substrate 202. In other words, the top module 212a vertically extends to below the isolation structures 203 and the devices 204.

Referring to FIG. 10F, the module 212 further includes a bottom portion 217b that partially penetrates the substrate 202 by a depth D7 that is less than the thickness of the substrate 202. In some examples, the depth D7 may be any suitable value according to specific design requirement and may be less than, the same as, or greater than the depth D6.

Referring to FIGS. 10G and 10H, the module 212 further includes a bottom portion 217c that partially penetrates the substrate 202 by a depth D8 that is less than the thickness of the substrate 202. In some examples, the depth D8 may be any suitable value according to specific design requirement and may be less than, the same as, or greater than the depths D6 and D7. The depicted embodiments illustrate an example embodiment in which the depth D8 is greater than the depth D6 in FIG. 10G and an example embodiment in which the depth D8 is less than the depth D6.

Figure 12:
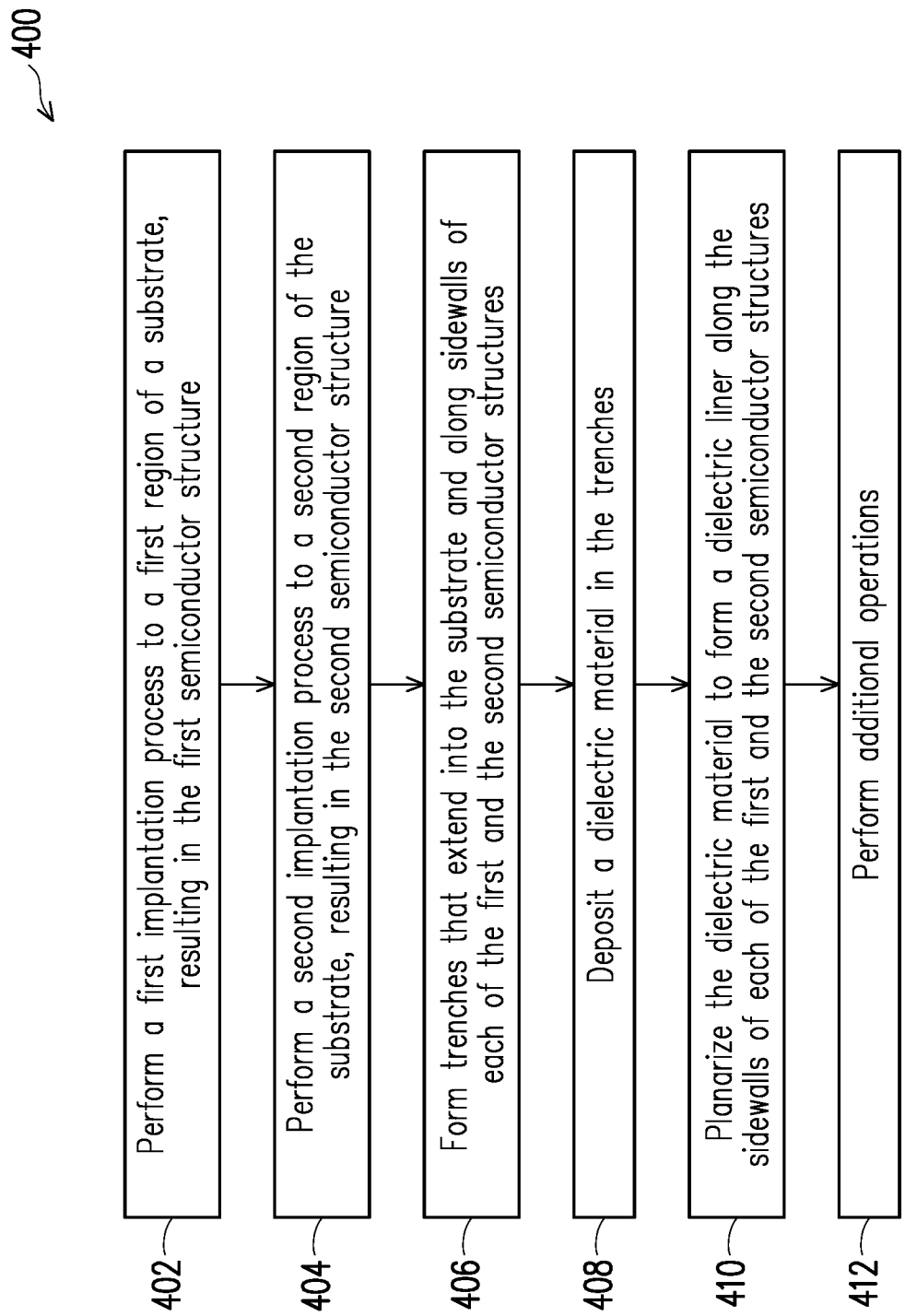
FIG. 12 is a flowchart of a method for fabricating an example integrated chip package (or portions thereof) according to various aspects of the present disclosure.
Figure 13D:
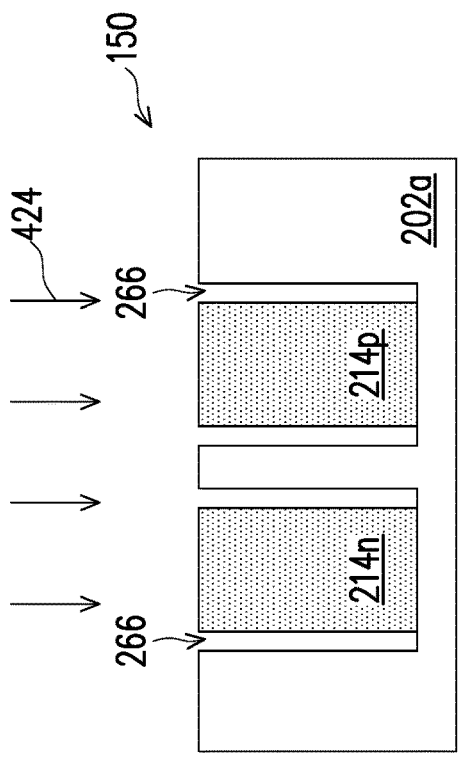
Figure 13F:
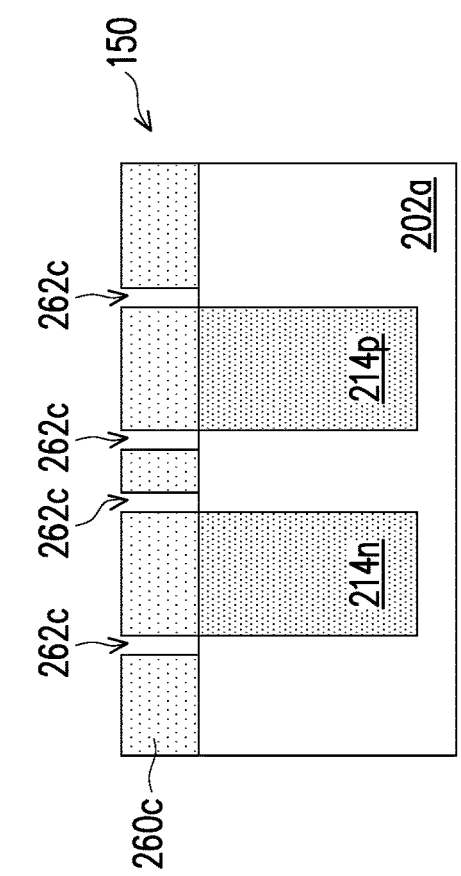
Figure 13E:
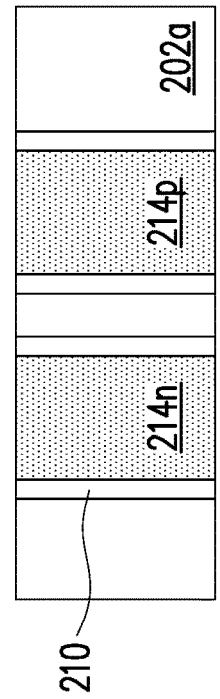

FIG. 11 illustrates a flowchart of a method 300 of fabricating an embodiment of the IC device 150, or a portion thereof, as depicted in one or more of FIGS. 2A and 3A-10H. FIGS. 12 and 14 illustrate a flowchart of a method 400 and a method 500, respectively, of fabricating an embodiment of a portion of the IC device 150. Method 300 is described in conjunction with FIGS. 13A-16S, which are cross-sectional views of the IC device 150. Specifically, method 400 is described in conjunction with FIGS. 13A-13G, and method 500 is described in conjunction with FIGS. 15A-15K and FIGS. 16A-16I. In some examples, methods 400 and 500 may each be implemented in place of one or more operations of method 300. Methods 300, 400, and 500 are merely examples and are not intended to limit the present disclosure beyond what is explicitly recited in the claims. Additional operations can be provided before, during, and after methods 300, 400, and 500 and some operations described can be replaced, eliminated, or moved around for additional embodiments of the methods.

It is noted that, because the process of forming the top chip 200a and the bottom chip 200b provided by embodiments of method 300 may be substantially the same, the following operations of method 300 are discussed with respect to forming the top chip 200a with the top module 212a embedded therein for purposes of simplicity.

Referring to FIG. 11, method 300 at operation 302 forms the top module 212a in the top chip. In the present embodiments, the top module 212a includes the n-type structure 214n and the p-type structure 214p electrically connected to the external power source 250, which are discussed above in detail with respect to one of more of FIGS. 2A and 3A-10H. In the present embodiments, the metal silicide layer 216 is formed over the top surface of each of the n-type structure 214n and the p-type structure 214p, where the metal silicide layer 216 is configured to electrically couple the top module 212a with the subsequently-formed MLI structure 220.

Figure 13G:
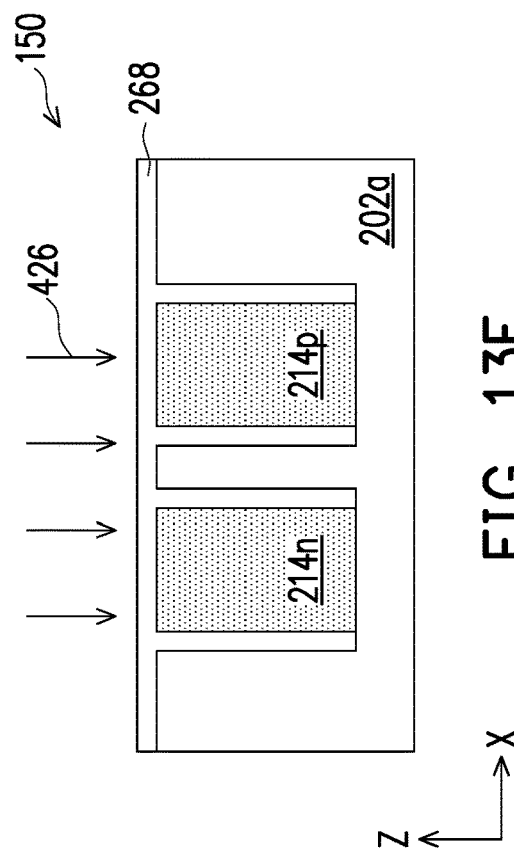
Figure 14:
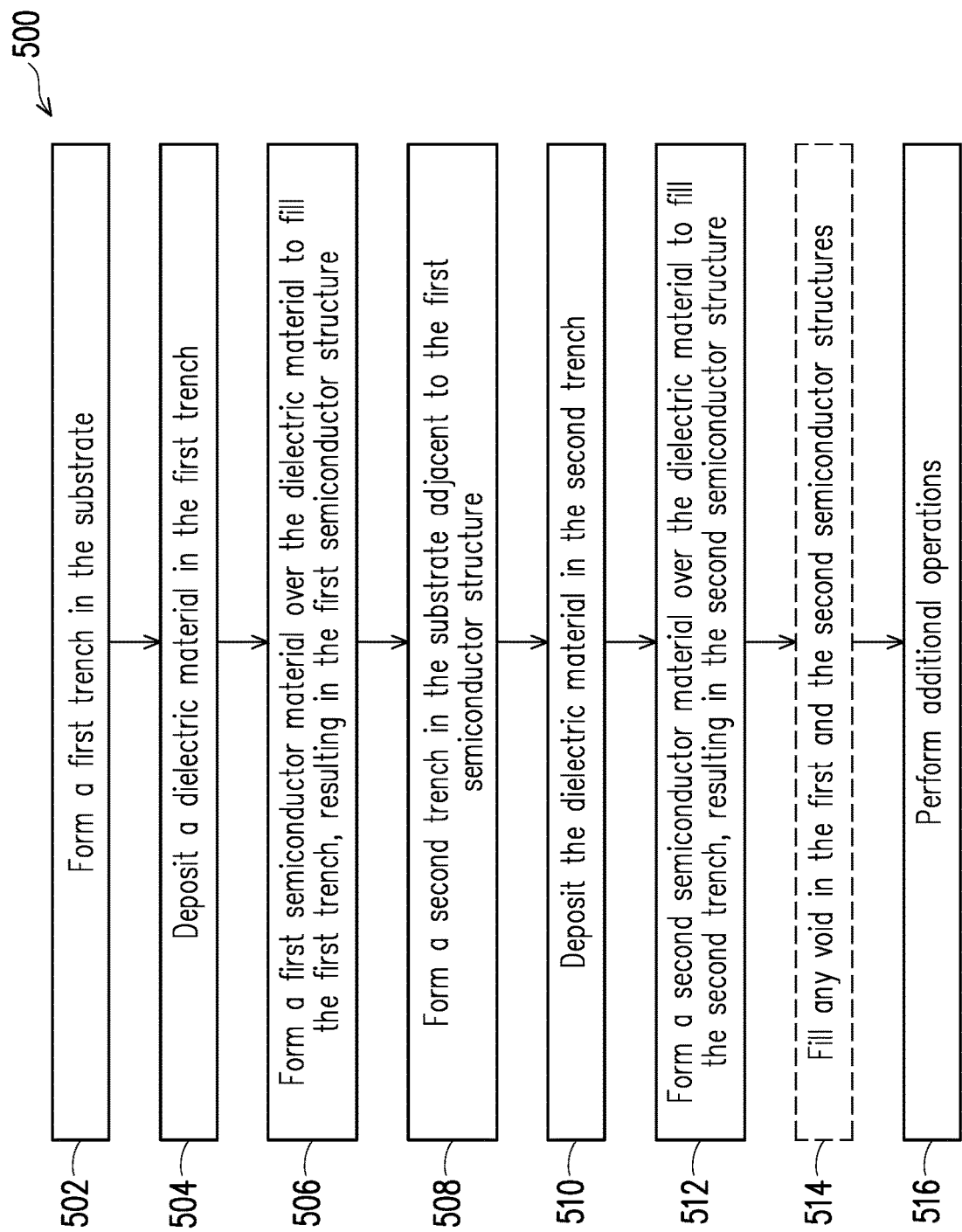
FIG. 14 is a flowchart of a method for fabricating an example integrated chip package (or portions thereof) according to various aspects of the present disclosure.

In the present embodiments, forming the top module 212a at operation 302 may be implemented by either method 400 as depicted in FIGS. 12-13G or method 500 as depicted in FIGS. 14-15J and 16A-16I.

Referring to FIGS. 12 and 13A, method 400 at operation 402 performs an implantation process 420 to a portion of the substrate 202. In the present embodiments, the implantation process 420 is an ion implantation process configured to dope a region of the substrate 202 with one or more n-type dopants, thereby forming the n-type structure 214n in the substrate 202. As depicted herein, the n-type structure 214n may be formed as a part of the top module 212a (i.e., embedded in the substrate 202). In some embodiments, performing the implantation process 420 includes first forming a patterned masking element 260a over the substrate 202, where the patterned masking element 260a exposes a portion of the substrate 202 in an opening 262a. The patterned masking element 260a may be formed via a photolithography process. The photolithography process may include forming a photoresist layer overlying the substrate 202, exposing the photoresist layer to a pattern, performing post-exposure bake processes, and developing the exposed photoresist layer to form the patterned masking element 260a. Subsequently, method 400 performs the implantation process 420, thereby introducing or doping the exposed portion of the substrate 202 with the n-type dopants to form the n-type structure 214n. In some embodiments, the n-type dopants include As, P, other n-type dopants, or combinations thereof. In some embodiments, the n-type dopants are introduced at a concentration of at least about $10^{17}$ cm$^{-3}$. In some embodiments, the concentration of the n-type dopants is at least about $10^{19}$ cm$^{-3}$. Thereafter, the patterned masking element 260a is removed from the substrate 202 by any suitable method, such as plasma ashing and/or resist stripping.

Referring to FIGS. 12 and 13B, method 400 at operation 404 performs an implantation process 322 to another portion of the substrate 202 adjacent to the n-type structure 214n. In the present embodiments, the implantation process 422 is an ion implantation process configured to dope a region of the substrate 202 with one or more p-type dopants to form the p-type structure 214p, resulting in the top module 212a as depicted in FIG. 13C. In some embodiments, the implantation process 422 is implemented in a manner substantially similar to that of implantation process 420. For example, method 400 first forms a patterned masking element 260b over the substrate 202 to expose a portion of the substrate 202 in an opening 262b that is adjacent to the n-type structure 214n, and subsequently performs the implantation process 422 to introduce the p-type dopants to the exposed portion of the substrate 202. The patterned masking element 260b may be substantially similar to the patterned masking element 260a in terms of composition and methods of formation. In some embodiments, the p-type dopants include B, In, Ga, other p-type dopants, or combinations thereof. In some embodiments, the p-type dopants are introduced at a concentration of at least about $10^{17}$ cm$^3$. In some embodiments, the concentration of the p-type dopants is at least about $10^{19}$ cm$^{-3}$. As provided herein, the n-type structure 214n and the p-type structure 214p include the same semiconductor material (e.g., both S1) as the substrate 202.

Thereafter, referring to FIG. 13C, the patterned masking element 260b is removed from the substrate 202 by any suitable method, such as plasma ashing and/or resist stripping. In some embodiments, the n-type structure 214n and the p-type structure 214p are formed to various configurations in a top view (i.e., in the XY plane) as discussed in detail above with respect to one or more of FIGS. 4A-4B, 6A-6B, 7A-7D, and 10A-10D.

Referring to FIGS. 12 and 13D-13E, method 400 at operation 406 forms trenches 266 that extend into the substrate 202 and along sidewalls of the n-type structure 214n and the p-type structure 214p. Referring to FIG. 13D, method 300 first forms a patterned masking element 260c over the n-type structure 214n and the p-type structure 214p to expose portions of the substrate 202 in openings 262c. The patterned masking element 260c may be substantially similar to the patterned masking element 260a in terms of composition and methods of formation. For example, the patterned masking element 260d may be formed by performing a photolithography process. Referring to FIG. 13E, method 300 then performs an etching process 424 using the patterned masking element 260c as an etch mask to form trenches 266 in the substrate 202, where the trenches 266 expose the sidewalls of the n-type structure 214n and the p-type structure 214p. The etching process 424 may be any suitable etching process, such as a dry etching process, a wet etching process, a reactive ion etching (RIE) process, or combinations thereof. Subsequently, the patterned masking element 260c is removed from the substrate 202 by any suitable method, such as plasma ashing and/or resist stripping.

Referring to FIGS. 12 and 13F, method 400 at operation 408 forms a dielectric layer 268 in the trenches 266 in a deposition process 426, during which portions of the dielectric layer 268 are formed over the substrate 202. The dielectric layer 268 is configured to electrically isolate or separate the n-type structure 214n and the p-type structure 214p from each other as well as other components (e.g., the devices 204) formed in the substrate 202. In the present embodiments, the dielectric layer 268 is an oxide material, such as silicon oxide (SiO and/or SiO$_2$). The deposition process 426 may be any suitable process, such as atomic layer deposition (ALD), chemical vapor deposition (CVD), physical vapor deposition (PVD), other processes, or combinations thereof. In the present embodiments, the deposition process 426 is an ALD process.

Referring to FIGS. 12 and 13G, method 400 at operation 410 performs a polishing process, such as a chemical-mechanical polishing/planarization (CMP) process, to remove the portions of the dielectric layer 268 formed over the substrate 202, leaving behind the dielectric liner 210 along the sidewalls of the n-type structure 214n and the p-type structure 214p. Subsequently, still referring to FIG. 13G, method 400 at operation 412 may perform additional fabrication processes, such as thinning the substrate 202 (e.g., from a backside of the substrate 202) to expose a bottom portion of the top module 212a. In the present embodiments, thinning the substrate 202 includes removing (by one or more CMP processes, for example) portions of the substrate 202 without removing, or substantially removing, portions of the n-type structure 214*n*, the p-type structure 214*p*, and the dielectric liner 210.

It is noted that the present disclosure does not limit the order in which the n-type structure 214*n* and the p-type structure 314*p* are formed, i.e., method 400 may form the n-type structure 214*n* before forming the p-type structure 214*p* as depicted herein or, alternatively, form the p-type structure 214*p* before forming the n-type structure 214*n*. After completing the formation of the top module 212*a*, method 300 may proceed to implementing operation 304 as depicted in FIG. 11.

Figure 15B:
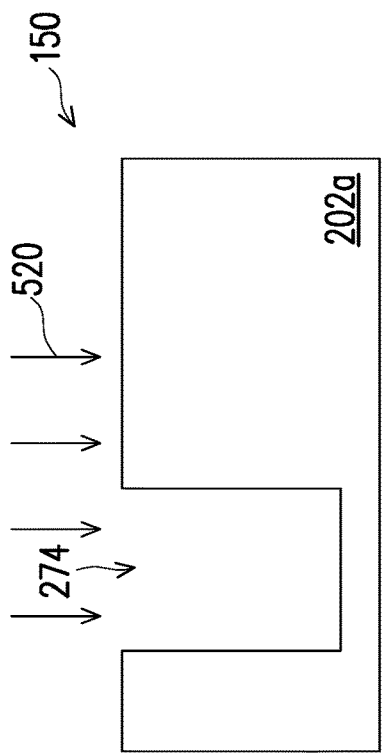
Figure 15D:
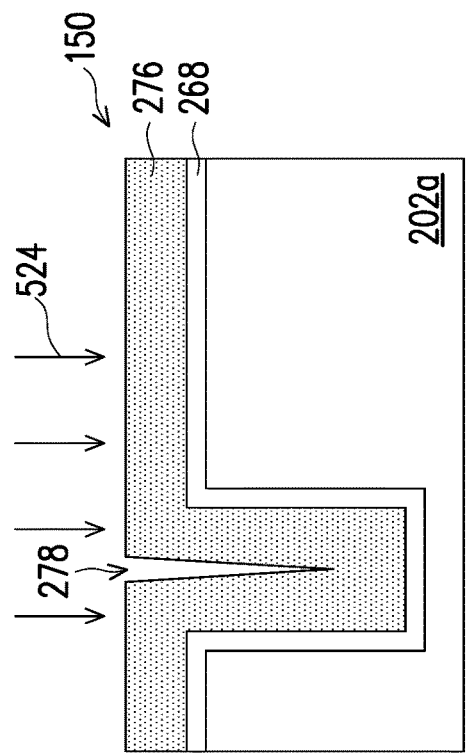
Figure 15A:
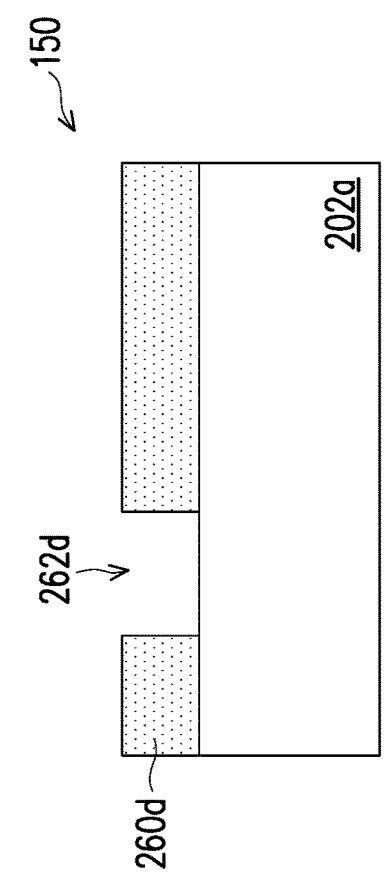

In an alternative embodiment, operation 302 of method 300 may be implemented by method 500, which is discussed in conjunction with FIGS. 14 and 15A-15K. Referring to FIGS. 14 and 15A-15B, method 500 at operation 502 forms an opening 274 that vertically extends into the substrate 202. Referring to FIG. 15A, method 500 first forms a patterned masking element 260*d* to expose a portion of the substrate 202 in openings 262*d*. The patterned masking element 260*d* may be substantially similar to the patterned masking element 260*a* in terms of composition and methods of formation. For example, the patterned masking element 260*d* may be formed by photolithography process. Referring to FIG. 15B, method 500 then performs an etching process 520 using the patterned masking element 260*d* as an etch mask to form the opening 274 in the substrate 202. The etching process 520 may be any suitable etching process, such as a dry etching process, a wet etching process, an RIE process, or combinations thereof. Thereafter, the patterned masking element 260*d* is removed from the substrate 202 by any suitable method, such as plasma ashing and/or resist stripping.

Figure 15C:
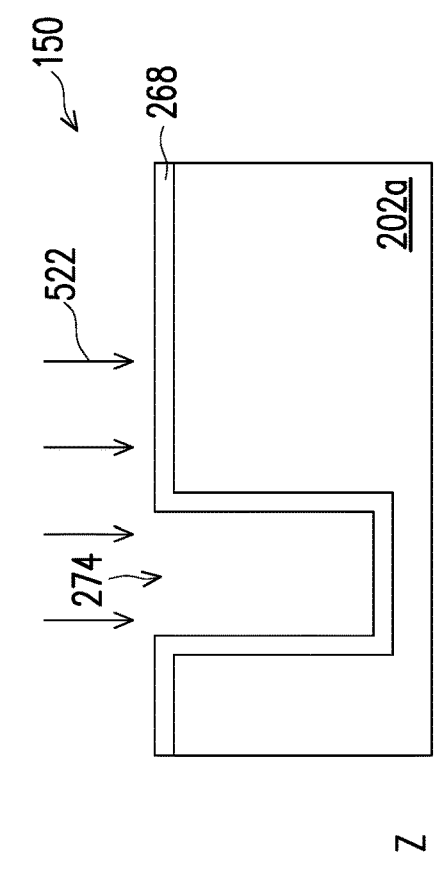
Figure 15E:
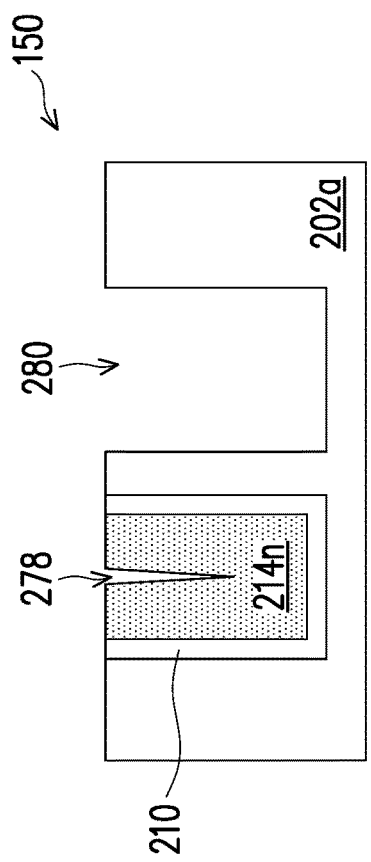

Referring to FIGS. 14 and 15C, method 500 at operation 504 conformally deposits the dielectric layer 268 in the opening 274 in a deposition process 522, during which portions of the dielectric layer 268 are formed over the top surface of the substrate 202. In the present embodiments, portions of the dielectric layer 268 formed in the opening 274 become the dielectric liner 210. The dielectric layer 268 may include silicon oxide and the deposition process 522 may be an ALD process similar to that discussed in detail above with respect to operation 408.

Subsequently, method 500 at operation 506 forms a semiconductor layer 276 over the dielectric layer 268 in a deposition process 524 to fill the opening 274, resulting in portions of the semiconductor layer 276 formed over the top surface of the substrate 202 as depicted in FIG. 15D. Thereafter, referring to FIG. 15E, method 500 performs one or more CMP processes to remove the portions of the dielectric layer 268 and the semiconductor layer 276 formed over the top surface of the substrate 202, resulting in the n-type structure 214*n*.

In the present embodiments, the semiconductor layer 276 includes a semiconductor material in a polycrystalline phase. For example, the semiconductor layer 276 may include polycrystalline Si (or poly Si), polycrystalline Ge, polycrystalline SiGe, other suitable semiconductor materials, or combinations thereof, doped with one or more n-type dopants. In some embodiments, the semiconductor layer 276 has the composition of the substrate 202 (e.g., both include S1). The n-type dopants may include As, P, other n-type dopants, or combinations thereof. In some embodiments, the n-type dopants in the semiconductor layer 276 have a concentration of at least about $10^{17}$ cm$^{-3}$. In some embodiments, the concentration of the n-type dopants is at least about $10^{19}$ cm$^{-3}$.

In some embodiments, the deposition process 524 is implemented with a CVD process, such as low-pressure CVD (LP-CVD), high-density plasma CVD (HDP-CVD), metal-organic CVD (MO-CVD), remote-plasma CVD (RP-CVD), a PVD process, other suitable processes, or combinations thereof. The n-type dopants may be introduced in-situ during the deposition process 524 or during a subsequent ion implantation process to the desired concentration provided herein. In some examples, as depicted herein, the deposition process 524 may result in a seam (or void) 278 extending along the Z axis into the semiconductor layer 276.

Figure 15G:
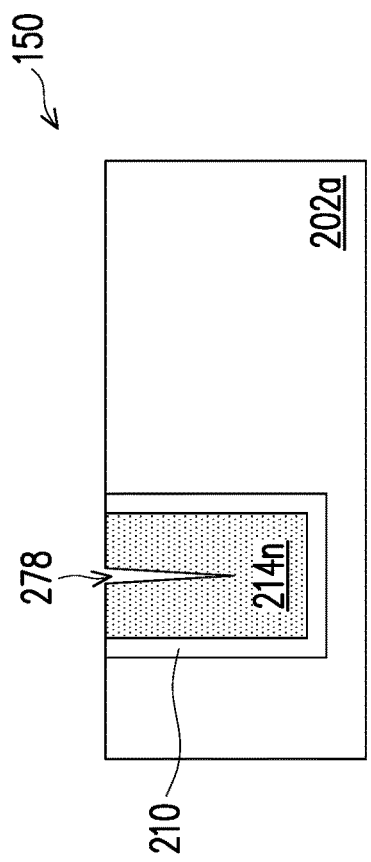
Figure 15F:
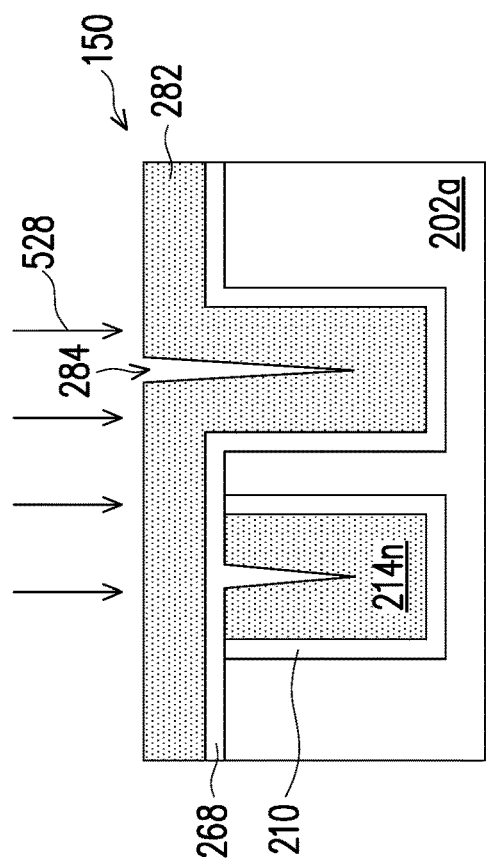

Now referring to FIGS. 14 and 15F, method 500 at operation 508 forms an opening 280 in the substrate 202 adjacent to the n-type structure 214*n* in a process similar to that discussed above with respect to operation 502.

Method 500 at operation 510 then forms the dielectric layer 268 over the substrate 202 in a deposition process 526, thereby partially filling the opening 280 as depicted in FIG. 15G. The deposition process 526 may be substantially similar to the deposition process 522 as discussed above with respect to operation 504. For embodiments in which the seam 278 is formed in the n-type structure 214*n*, the dielectric layer 268 fills the seam 278 at operation 510.

Figure 15H:
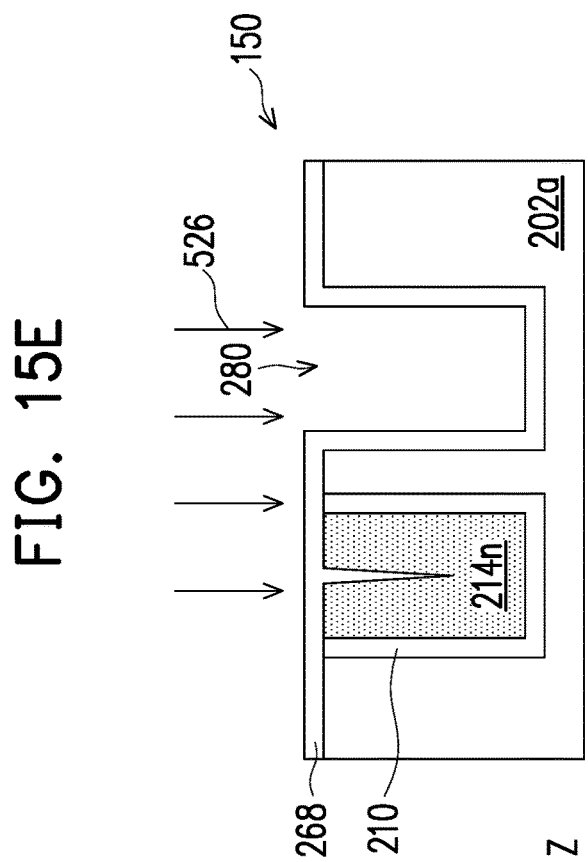

Subsequently, method 500 at operation 512 forms a semiconductor layer 282 over the dielectric layer 268 in a deposition process 528 to fill the opening 280, resulting in portions of the semiconductor layer 282 formed over the top surface of the substrate 202 as depicted in FIG. 15H. In the present embodiments, similar to the semiconductor layer 276, the semiconductor layer 282 includes a semiconductor material in a polycrystalline phase. For example, the semiconductor layer 282 may include poly S1, polycrystalline Ge, polycrystalline SiGe, other suitable semiconductor materials, or combinations thereof, doped with one or more p-type dopants. In some embodiments, the semiconductor layer 282 has the composition of the substrate 202 (e.g., both include S1). In some embodiments, the semiconductor layers 276 and 282 have different compositions (e.g., one may include S1 and the other may include SiGe). The p-type dopants may include B, Ga, In, other p-type dopants, or combinations thereof. In some embodiments, the p-type dopants in the semiconductor layer 282 have a concentration of at least about $10^{17}$ cm$^{-3}$. In some embodiments, the concentration of the p-type dopants is at least about $10^{19}$ cm$^3$.

The deposition process 528 may be substantially similar to the deposition process 524 as discussed above with respect to operation 506. In some embodiments, referring to FIG. 15H, the deposition process 528 results in a seam 284 vertically extending into the semiconductor layer 282. Thereafter, referring to FIG. 15I, method 500 performs one or more CMP processes to remove the portions of the dielectric layer 268 and the semiconductor layer 282 formed over the top surface of the substrate 202, resulting in the p-type structure 214*p*.

Referring to FIGS. 14 and 15J, method 500 at operation 514 fills the seam 284 with a dielectric layer 286. The dielectric layer 286 may include any suitable material, such as silicon oxide, and may be formed by any suitable process, such as ALD. Method 500 may first perform a deposition process to form the dielectric layer 286 over the n-type structure 214*n* and the p-type structure 214*p* and then performs one or more CMP process to planarize a top surface of the dielectric layer 286 with the top surface of the substrate 202, resulting in the top module 212*a*. For embodiments in which the seam 284 is not formed during operation 512, operation 514 may be omitted.

Subsequently, referring to FIGS. 14 and 15K, method 500 at operation 516 may perform additional operations, such as thinning the backside of the substrate 202 to expose bottom portions of the n-type structure 214n and the p-type structure 214p. In the present embodiments, thinning the backside of the substrate 202 at operation 516 includes removing (by one or more CMP processes, for example) bottom portions of the substrate 202 and the dielectric liner 210 that are oriented parallel to a bottom surface of the substrate 202 without removing, or substantially removing, the n-type structure 214n and the p-type structure 214p. In some embodiments, thinning the backside of the substrate 202a may be performed after forming other features, such as the MLI structure 220, the TSV 206, the seal ring structure 228, etc.

Figure 16D:
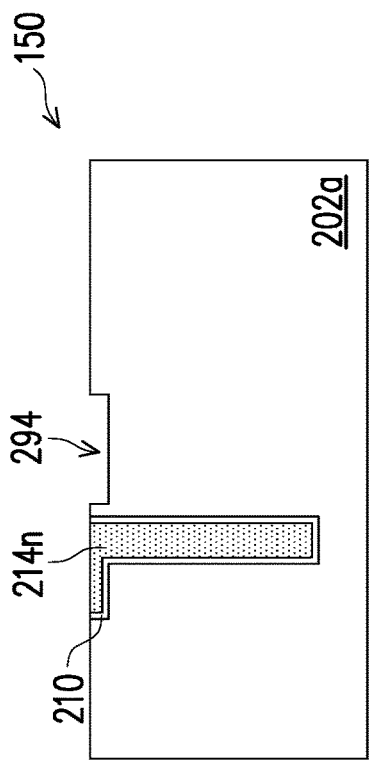

In some embodiments, the n-type structure 214n and the p-type structure 214p are formed to various configurations in a top view (i.e., in the XY plane) as discussed in detail above with respect to FIGS. 4A-4B, 6A-6B, 7A-7D, and 10A-10D. In this regard, FIGS. 16A-16I depict an alternative embodiment of forming the top module 212a using method 500. Referring to FIGS. 14 and 16A, method 500 at operation 502 forms an opening 290 in the substrate 202a using a patterned masking element 260e as an etch mask, in a process similar to that of forming the opening 274 as depicted in FIG. 15B. In the depicted embodiments, the opening 290 defines, at least in part, the top portion 215 (see FIG. 16D, for example) of the n-type structure 214n that extends laterally across the XY plane. Referring to FIG. 16B, method 500 at operation 502 forms an opening 292 to extend the opening 290 vertically into the substrate 202a. In the present embodiments, the opening 292 defines, at least in part, the bottom portion 217 (see FIG. 16D, for example) of the n-type structure 214n embedded in the substrate 202a. The opening 292 may be formed by a process similar to that of forming the opening 290. For example, a masking element (not depicted) including a photoresist layer may be deposited over the substrate 202a to fill the opening 290 and subsequently patterned to form an opening (not depicted) that exposes a portion of the substrate 202a, which may then be etched to form the opening 292 using the patterned masking element as an etch mask.

Referring to FIGS. 14 and 16C, method 500 at operations 504 and 506 deposits the dielectric layer 268 over the substrate 202a and the semiconductor layer 276 over the dielectric layer 268, thereby filling the openings 290 and 292. Processes of depositing the dielectric layer 268 and the semiconductor layer 276 are discussed in detail above with respect to FIGS. 15C and 15D. Subsequently, referring to FIG. 16D, method 500 performs one or more CMP processes to remove portions of the dielectric layer 268 and the semiconductor layer 276 from the substrate 202a, resulting in the n-type structure 214n over the dielectric liner 210.

Figure 16E:
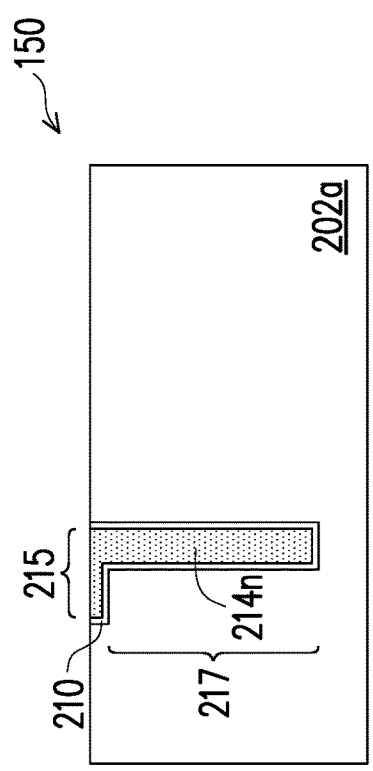
Figure 16F:
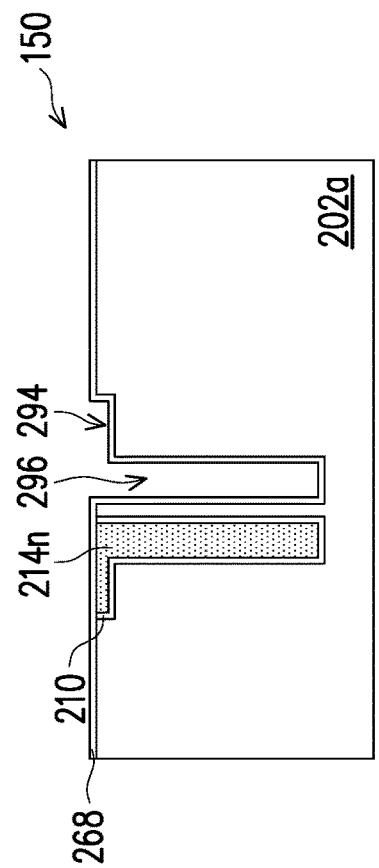

Referring to FIGS. 14 and 16E-16F, method 500 at operation 508 forms openings 294 and 296 in the substrate 202a and adjacent to the n-type structure 214n. Processes of forming the openings 294 and 206 are substantially similar to those of forming the openings 290 and 292, respectively, as discussed in detail above with respect to FIGS. 16A-16B.

Figure 16G:
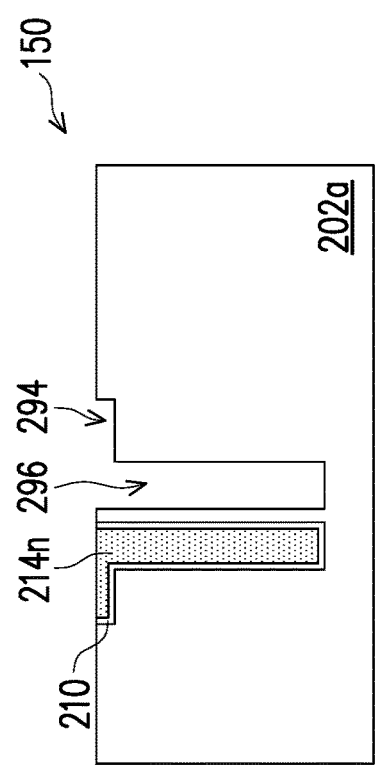
Figure 16H:
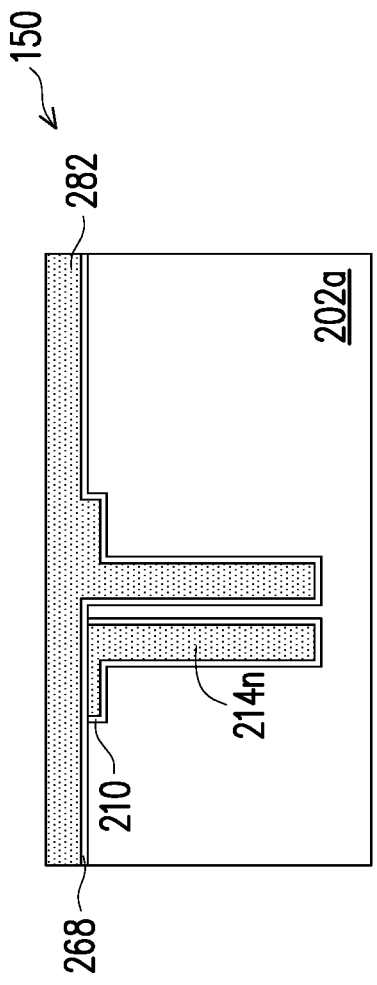
Figure 16I:
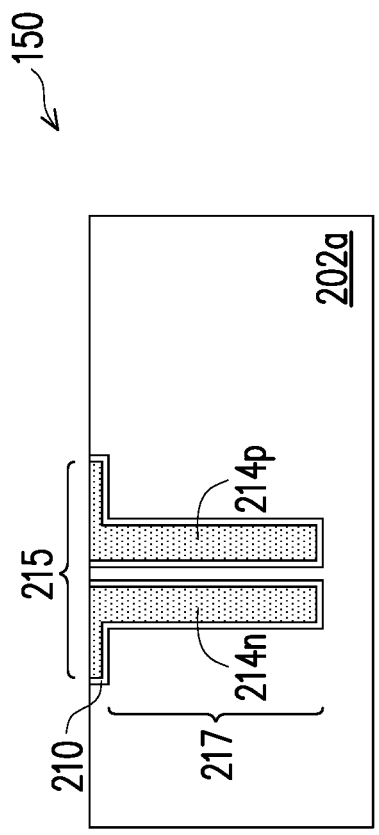

Referring to FIGS. 14 and 16G-16H, method 500 at operations 510 and 512 deposits the dielectric layer 268 over the substrate 202a and the semiconductor layer 282 over the dielectric layer 268, thereby filling the openings 294 and 296, in a series of processes similar to those of operations 504 and 506, respectively, as discussed in detail above with respect to FIG. 16C. Subsequently, referring to FIG. 16I, method 500 performs one or more CMP processes to remove portions of the dielectric layer 268 and the semiconductor layer 282 from the substrate 202a, resulting in the p-type structure 214p over the dielectric liner 210.

Method 500 at operation 516 may then perform additional processing steps. It is noted that the present disclosure does not limit the order in which the n-type structure 214n and the p-type structure 314p are formed, i.e., i.e., method 500 may form the n-type structure 214n before forming the p-type structure 214p as depicted herein or, alternatively, form the p-type structure 214p before forming the n-type structure 214n.

After completing the formation of the top module 212a, method 300 may proceed to implementing operation 304. Referring to FIGS. 11 and 16J, method 300 at operation 304 forms devices 204 in and/or over the substrate 202. The devices 204 may be FETs (e.g., planar FETs, FinFETs, nanosheet FETs, and/or other suitable devices), memory cells, imaging sensors, passive devices, other devices, or combinations thereof, separated by the isolation structures 203. The device 204 may include the gate structure 205 engaging with source/drain features of one or more active regions (e.g., fins, nanosheets, doped wells, and/or other suitable regions) formed in and/or over the substrate 202a. Additional features, such as the ILD layer 108, the device-level contacts 218, and a portion of the seal ring structure 228, may be formed in and/or over the substrate 202a before, after, or during the process of forming the devices 204.

Referring to FIG. 16K, method 300 at operation 306 forms the MLI structure 220 over the substrate 202a, where the MLI structure 220 is electrically coupled to the devices 204 and the top module 212a via the device-level contacts 218, for example. The MLI structure 220 may be formed to include various interconnect features, such as the conductive lines 224 and the vias 226, disposed in the dielectric layers, such as the ILD layers 221 and the ESLs 222.

Figure 16L:
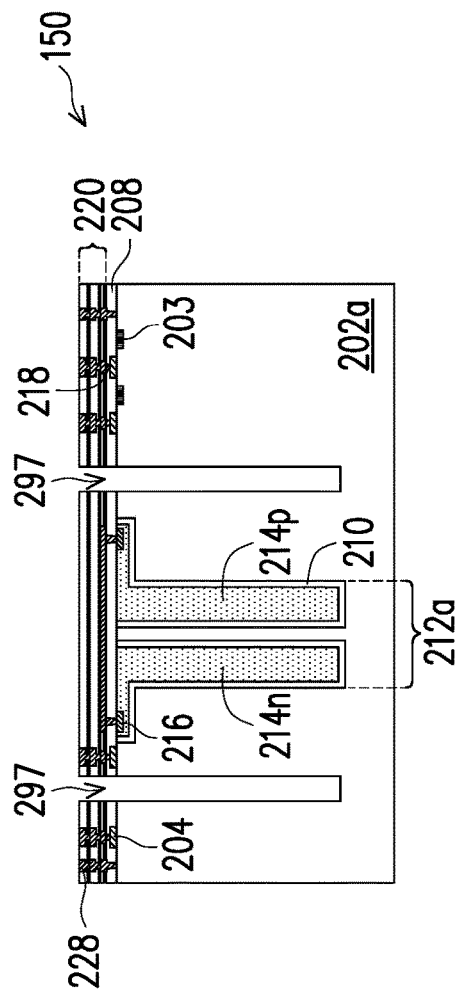
Figure 16M:
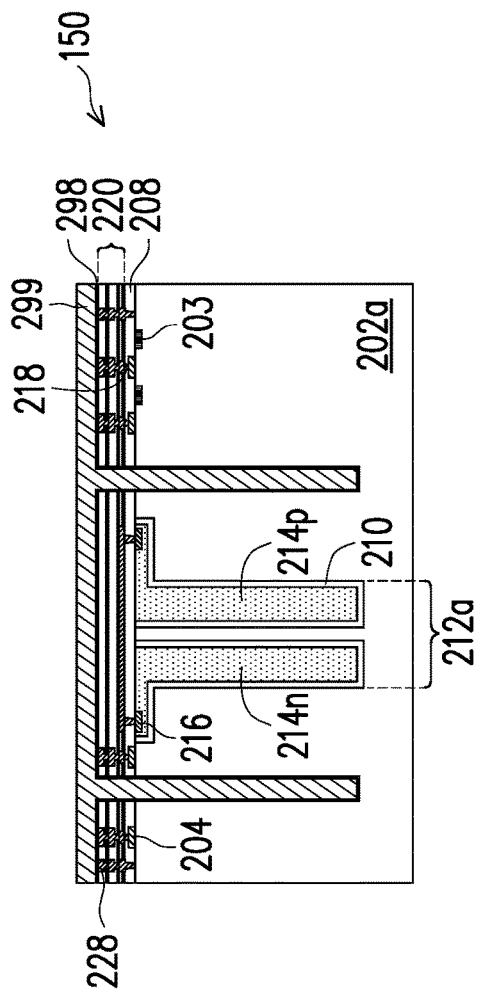
Figure 16N:
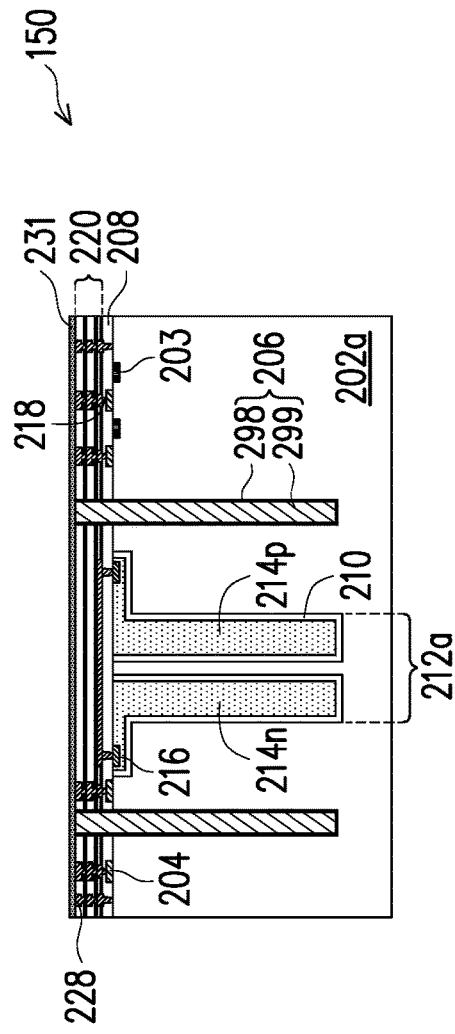

Referring to FIGS. 16L-16N, method 300 at operation 306 forms additional features, such as the TSV 206, in the IC device 150. In the depicted embodiments, method 300 first forms trenches 297 through the MLI structure 220 and at least a portion of the substrate 202a as depicted in FIG. 16L. The trenches 297 may be formed using a patterned masking element (not depicted) similar to the patterned masking element 260a discussed in detail above with respect to forming the opening 290 at operation 502. Referring to FIG. 16M, method 300 then deposits a seed layer 298 over the trenches 297 and a conductive layer 299 over the seed layer 298. The seed layer 298 and the conductive layer 299 may be deposited by any suitable method, such as ALD, CVD, PVD, plating, other suitable methods, or combinations thereof.

Figure 16O:
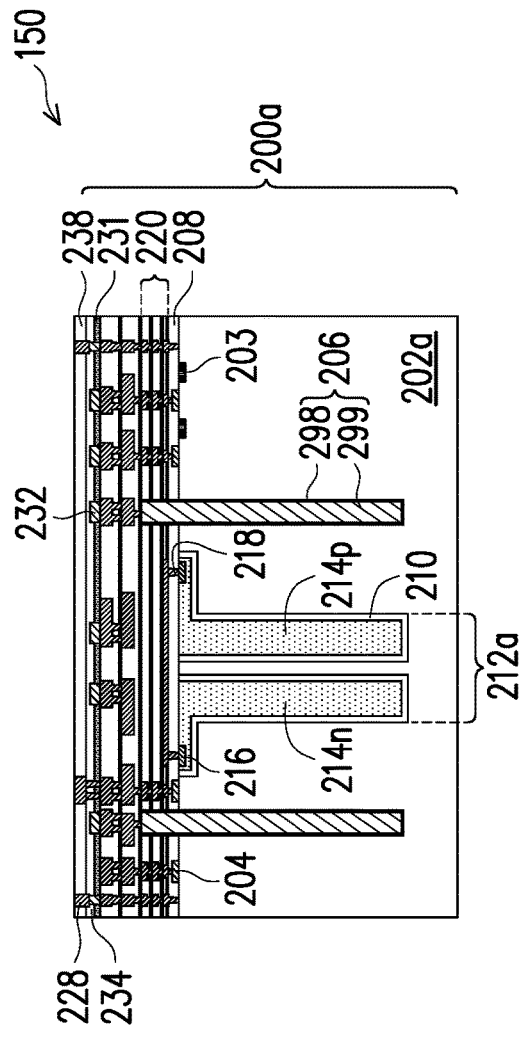
Figure 16P:
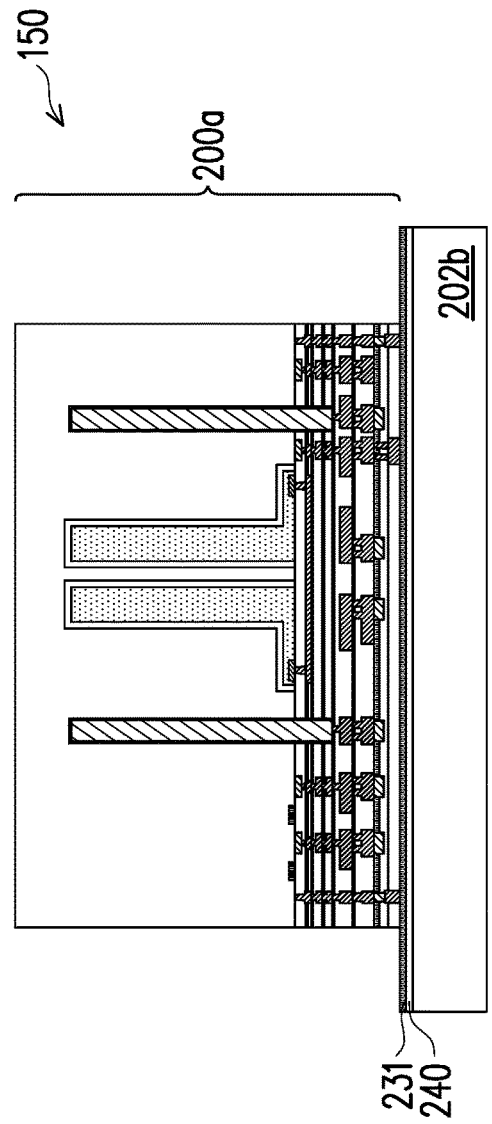

Subsequently, referring to FIG. 16N, method 300 performs one or more CMP processes to planarize a top surface of the TSV 206 with a top surface of the MLI structure 220. Thereafter, still referring to FIG. 16N, method 300 at operation 306 forms the passivation layer 231 over the TSV 206. Referring to FIG. 16O, method 300 at operation 306 may form additional conductive features, such as the conductive pads 232 and the seal ring structure 228, embedded in various insulating features and form a bonding film, such as the dielectric bonding film 238 for hybrid bonding over the MLI structure 220.

Figure 16Q:
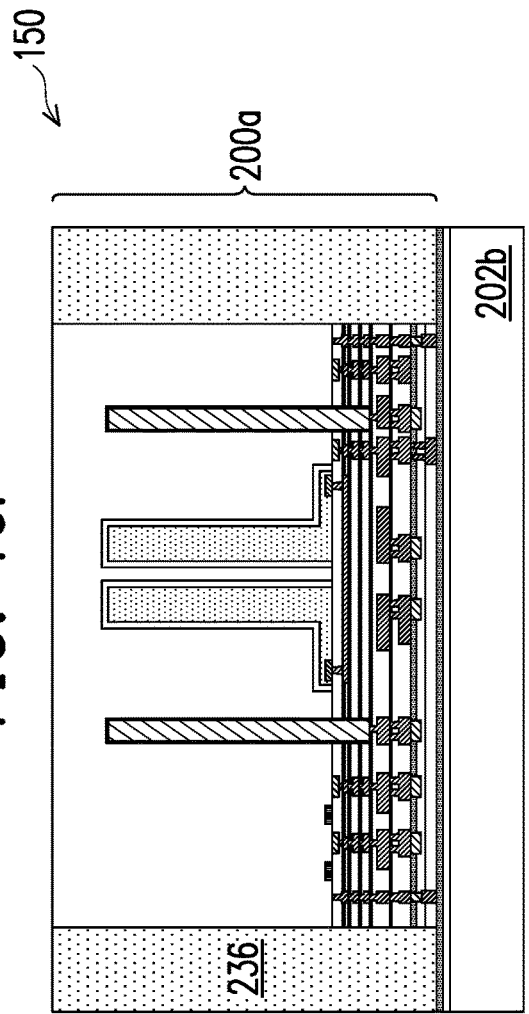
Figure 16R:
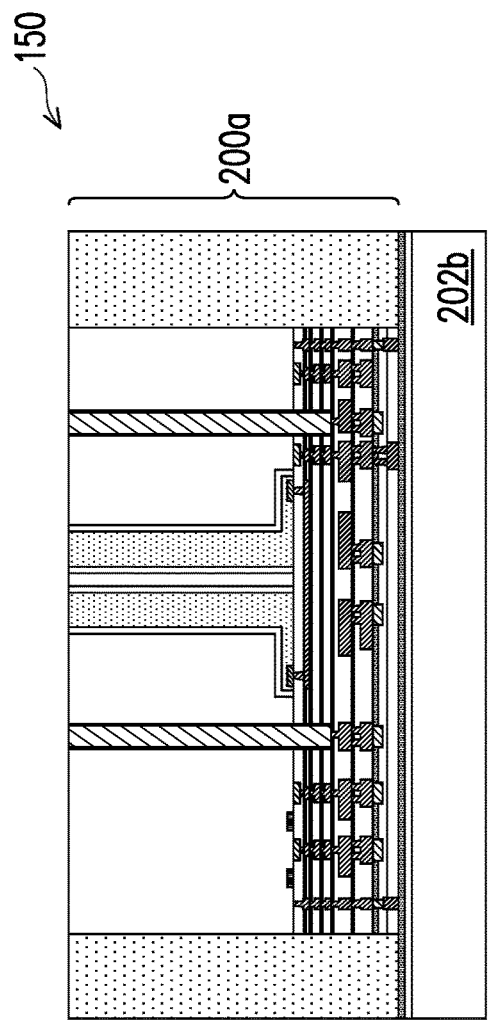
Figure 16S:
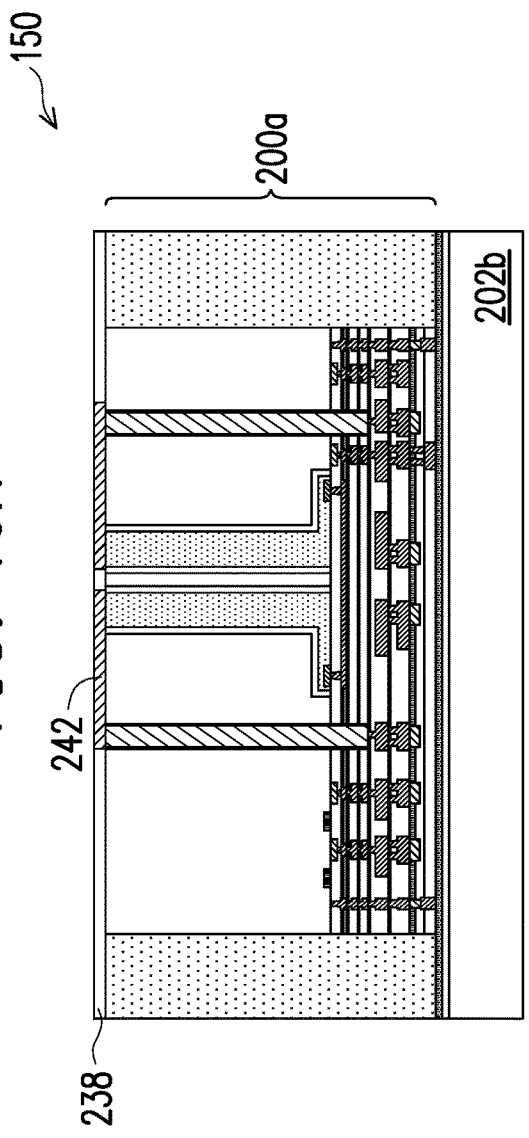

Method 300 at operation 308 may then perform additional operations to process the IC device 150. For examples, referring to FIG. 16P, method 300 at operation 308 may form the passivation layer 231 over the MLI structure 220 and one or more bonding films, such as the fusion bonding film 240 (including, for example, silicon oxynitride, silicon oxide, other suitable materials, or combinations thereof), over the passivation layer 231 to allow bonding of the top chip 200a with additional chip(s) or substrate(s) into a desired configuration (e.g., SoIC, CoWoS, InFO, or combinations thereof). Referring to FIG. 16Q, method 300 may form a dielectric layer 236 over the IC device 150 to fill any gap along sidewalls of the top chip 200a and perform a CMP process to planarize the dielectric layer 236. Subsequently, referring to FIG. 16R, method 300 performs a thinning process to remove a portion of the substrate 202a, thereby exposing the top module 212a and the TSV 206. The thinning process may be substantially similar to that discussed above with respect to operation 516. Thereafter, referring to FIG. 16S, method 300 may form another dielectric bonding film 238 over a backside of the top chip 200a and form contact features 242 over the exposed top module 212a and the TSV 206. Though not depicted, bumps 244 may be formed over the contact features 242 to electrically connect the top chip 200a with additional components, such as a packaging substrate, an interposer, an RDL, other suitable components, or combinations thereof, according to a desired packaging configuration.

Although not intended to be limiting, one or more embodiments of the present disclosure provide many benefits to a semiconductor device and the formation thereof. The present disclosure is directed to a thermoelectric device embedded within an IC chip package to provide cooling of portions of the IC chip package when a voltage is applied. The present disclosure is further directed to a thermoelectric device embedded within an IC chip package for purposes of detecting changes in temperature in portions of the IC chip package during operation. In the present embodiments, the thermoelectric device includes an n-type semiconductor structure disposed adjacent to a p-type semiconductor structure and is electrically coupled to an external power supply. The thermoelectric device may be embedded in one or more chips of the IC chip package and electrically coupled to allow various portions of the IC chip package to be cooled and/or to detect changes in device temperature. In some embodiments, a top portion of the thermoelectric device spans across a surface of a substrate to increase detection area. In some embodiments, the thermoelectric device is electrically isolated from the substrate by a dielectric liner. Embodiments of the present disclosure may be readily incorporated into various 3D chip package configurations, such as SoIC, CoWoS, InFO, 3DFabric, other suitable configurations, or combinations thereof.

In one aspect, the present disclosure provides an IC device that includes a chip having a semiconductor substrate. The IC device also includes a thermoelectric module embedded in the semiconductor substrate, where the thermoelectric module includes a first semiconductor structure electrically connected to a second semiconductor structure, where a bottom portion of thermoelectric module extends through a thickness of the semiconductor substrate, and where the first semiconductor structure and the second semiconductor structure include dopants of different conductivity types.

In another aspect, the present disclosure provides a chip package that includes a bottom chip having a first substrate and a top chip electrically bonded to the bottom chip, where the top chip includes a second substrate. The chip package also includes a thermoelectric device embedded in the second substrate, where the thermoelectric device includes an n-type structure coupled to a p-type structure, and where each of the n-type structure and the p-type structure extends to contact the bottom chip.

In yet another aspect, the present disclosure provides a method that includes forming a first semiconductor structure that extends into the a substrate. The method also includes forming a second semiconductor structure that extends into the substrate and adjacent the first semiconductor structure, where the first semiconductor structure and the second semiconductor structure include dopants of different conductivity types. The method also includes forming a dielectric liner along each sidewall of the first semiconductor structure and the second semiconductor structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) device, comprising:
    a chip including:
        a semiconductor substrate;
        a plurality of field effect transistors formed on active regions of the semiconductor substrate;
        isolation structures extending into the semiconductor substrate and separating the plurality of field effect transistors; and
        a multi-layer interconnect (MLI) structure disposed over a first surface of the semiconductor substrate and connecting the plurality of field effect transistors;
    a thermoelectric module embedded in the semiconductor substrate, wherein the thermoelectric module includes a first semiconductor structure electrically connected to a second semiconductor structure, wherein the thermoelectric module extends through a thickness of the semiconductor substrate from the first surface to an opposing backside surface, and wherein the first semiconductor structure and the second semiconductor structure include dopants of different conductivity types.

2. The IC device of claim 1, the chip being a first chip, the semiconductor substrate being a first semiconductor substrate, and the thermoelectric module being a first thermoelectric module, the IC device further comprising a second chip, wherein the second chip includes a second semiconductor substrate and a second thermoelectric module embedded in the second semiconductor substrate, and wherein the first thermoelectric module and the second thermoelectric module are electrically connected.

3. The IC device of claim 1, wherein each of the first and the second semiconductor structures are separated from a silicon material of the semiconductor substrate by a dielectric layer.

4. The IC device of claim 1, wherein a bottom portion of the thermoelectric module includes slanted sidewalls.

5. The IC device of claim 1, wherein a bottom portion of the thermoelectric module includes curved sidewalls.

6. The IC device of claim 1, wherein the thermoelectric module includes a top portion that laterally extends across a surface that is parallel to the top surface of the semiconductor substrate.

7. The IC device of claim 1, further comprising a voltage sensor electrically connected to the thermoelectric module.

8. The IC device of claim 1, further comprising a power supply electrically connected to the thermoelectric module.

9. A chip package, comprising:
a bottom chip including a first substrate;
a top chip electrically bonded to the bottom chip, wherein the top chip includes a second silicon substrate, the second silicon substrate having a first surface and a second surface opposing the first surface, a plurality of active devices formed on the second silicon substrate; and
a thermoelectric device embedded within the second silicon substrate and extending from the first surface to the second surface, wherein the thermoelectric device includes an n-type structure coupled to a p-type structure, and wherein each of the n-type structure and the p-type structure extends to contact the bottom chip.

10. The chip package of claim 9, wherein the thermoelectric device further includes a dielectric liner separating sidewalls of the n-type structure and the p-type structure from silicon composition of the second silicon substrate.

11. The chip package of claim 9, wherein one of the top chip and the bottom chip further includes:
the plurality of active devices including a transistor disposed on the first surface of the second silicon substrate,
isolation structures disposed over the second silicon substrate and adjacent to the transistor,
a multi-layer interconnect (MLI) structure including a plurality of metal lines and vias disposed in dielectric layers and electrically coupled to the transistor, and
a silicide layer disposed between the MLI structure and each of the n-type structure and the p-type structure.

12. The chip package of claim 9, wherein the thermoelectric device is electrically coupled to a power supply or a voltmeter.

13. The chip package of claim 9, wherein at least one of the n-type structure and the p-type structure is configured with slanted sidewalls in a cross-sectional view.

14. The chip package of claim 9, wherein the thermoelectric device is a first thermoelectric device, the chip package further comprising a second thermoelectric device extending through the first substrate and electrically coupled to the first thermoelectric device, wherein a power supply is electrically coupled to the first thermoelectric device through the second thermoelectric device.

15. The chip package of claim 9, wherein dopant concentration in each of the n-type structure and the p-type structure is at least about $10^{17}$ cm$^{-3}$.

16. A device, comprising:
a first chip including a first semiconductor substrate, wherein the first semiconductor substrate includes an active region disposed on a first surface or protruding from the first surface and a gate structure engaging with the active region; and
a thermoelectric module embedded in the first semiconductor substrate, wherein the thermoelectric module includes:
a first semiconductor structure extending from the first surface to a second surface of the first semiconductor substrate, and wherein the first semiconductor structure is a first conductivity type; and
a second semiconductor structure extending from the first surface to the second surface and spaced a lateral distance from the first semiconductor structure, and wherein the second semiconductor structure is a second conductivity type.

17. The device of claim 16, wherein the thermoelectric module includes a first liner interposing the first semiconductor structure and the first semiconductor substrate, and a second liner interposing the second semiconductor structure and the first semiconductor substrate.

18. The device of claim 16, wherein the first semiconductor structure and the second semiconductor structure are electrically connected.

19. The device of claim 16, further comprising:
a second chip including a second semiconductor substrate, wherein the second chip is bonded to the first chip.

20. The device of claim 16, wherein in a cross-sectional view the first semiconductor structure has a first width adjacent the first surface and a second width adjacent the second width adjacent the second surface, the second width less than the first width.

* * * * *